United States Patent
Andersen

(10) Patent No.: US 12,155,202 B2
(45) Date of Patent: Nov. 26, 2024

(54) SYSTEMS AND METHODS FOR ARC FLASH INCIDENT ENERGY REDUCTION

(71) Applicant: SCHNEIDER ELECTRIC IT CORPORATION, Foxboro, MA (US)

(72) Inventor: Claus Aabjerg Andersen, Kolding (DK)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 423 days.

(21) Appl. No.: 17/575,681

(22) Filed: Jan. 14, 2022

(65) Prior Publication Data

US 2022/0231500 A1   Jul. 21, 2022

Related U.S. Application Data

(60) Provisional application No. 63/137,907, filed on Jan. 15, 2021.

(51) Int. Cl.
*H05K 7/14* (2006.01)
*H02H 9/00* (2006.01)

(52) U.S. Cl.
CPC ........... *H02H 9/004* (2013.01); *H05K 7/1492* (2013.01)

(58) Field of Classification Search
CPC . H05K 7/1492; H05K 7/1495; H05K 7/20181
See application file for complete search history.

(56) References Cited

U.S. PATENT DOCUMENTS

| | | | |
|---|---|---|---|
| 6,407,331 B1 | 6/2002 | Smith et al. | |
| 8,256,305 B2 | 9/2012 | Bean, Jr. et al. | |
| 8,791,361 B2 * | 7/2014 | Gingrich | H02B 1/565 361/605 |
| 9,577,411 B2 * | 2/2017 | Deb | H02B 13/025 |
| 10,431,963 B2 * | 10/2019 | Rajauria | H02B 1/30 |
| 10,624,241 B1 * | 4/2020 | Ross | H05K 7/20736 |
| 11,159,000 B2 * | 10/2021 | Hawkins | H01H 33/04 |
| 11,778,792 B2 * | 10/2023 | Oda | H02M 1/32 363/50 |
| 11,982,294 B2 * | 5/2024 | Andersen | H05K 7/20172 |
| 2015/0163957 A1 * | 6/2015 | Martinez-Cruz | H05K 7/20009 454/184 |
| 2020/0281090 A1 | 9/2020 | Huangfu et al. | |
| 2020/0344908 A1 | 10/2020 | Liu et al. | |

FOREIGN PATENT DOCUMENTS

EP         2403148 A1    1/2012

OTHER PUBLICATIONS

Extended European Search Report from corresponding European Application No. 22151482.1 dated Jun. 10, 2022.

* cited by examiner

*Primary Examiner* — Robert J Hoffberg
(74) *Attorney, Agent, or Firm* — Lando & Anastasi, LLP

(57) ABSTRACT

An assembly to contain energy from arc flash within a mounting slot of an equipment rack includes a valve panel assembly including a first valve panel body secured to the frame members by a first hinge and a second valve panel body secured to the frame members by a second hinge. The first valve panel body and the second valve panel body are configured to rotate between closed positions and open positions. A method of assembling a system to contain energy from arc flash within a mounting slot of an equipment rack is further disclosed.

23 Claims, 35 Drawing Sheets

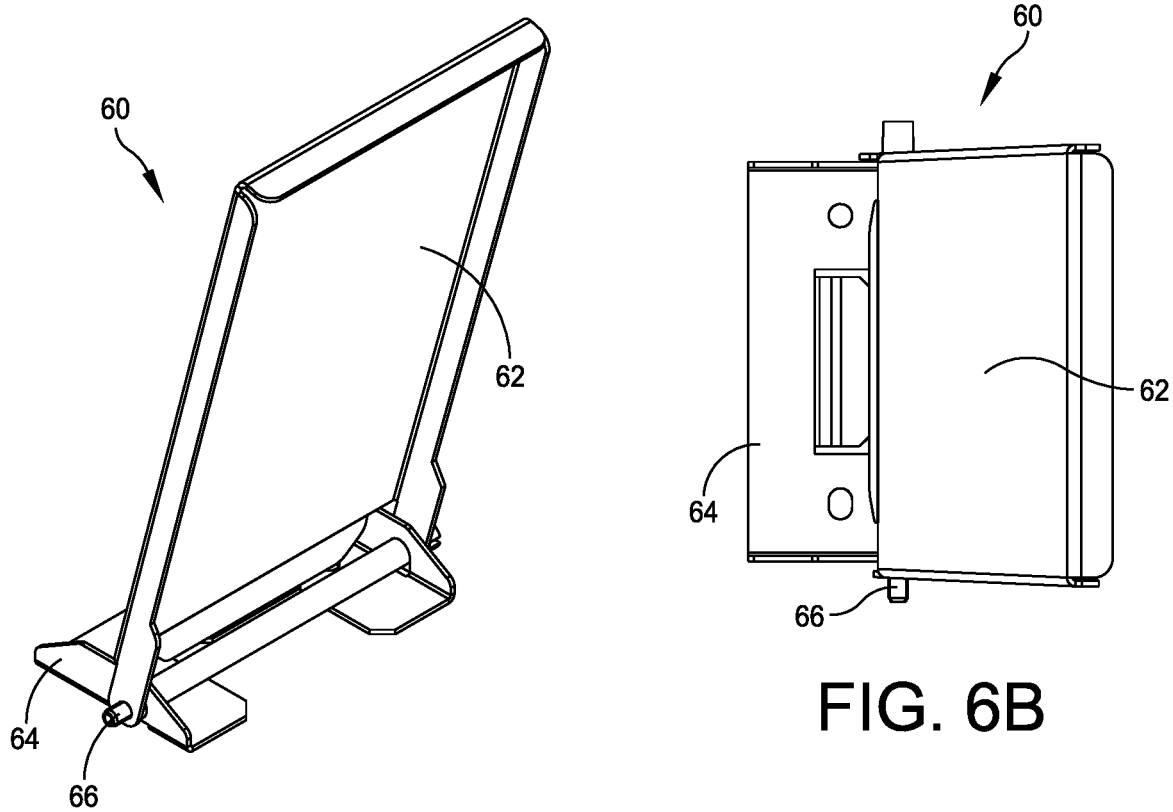
FIG. 6A
FIG. 6B
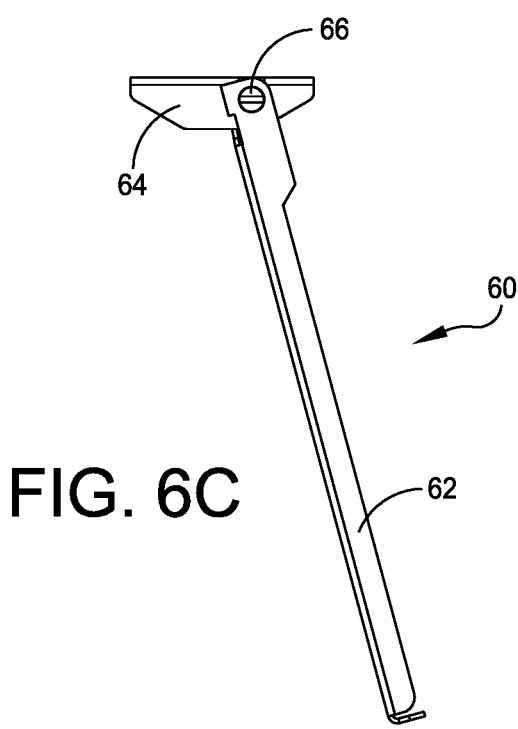
FIG. 6C

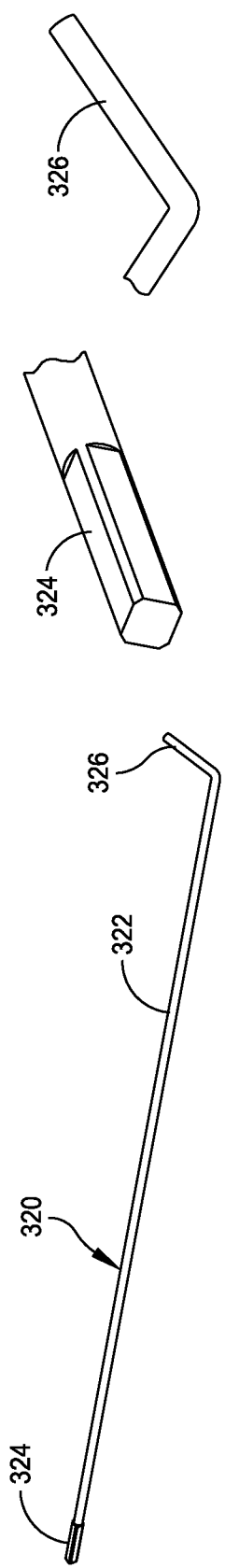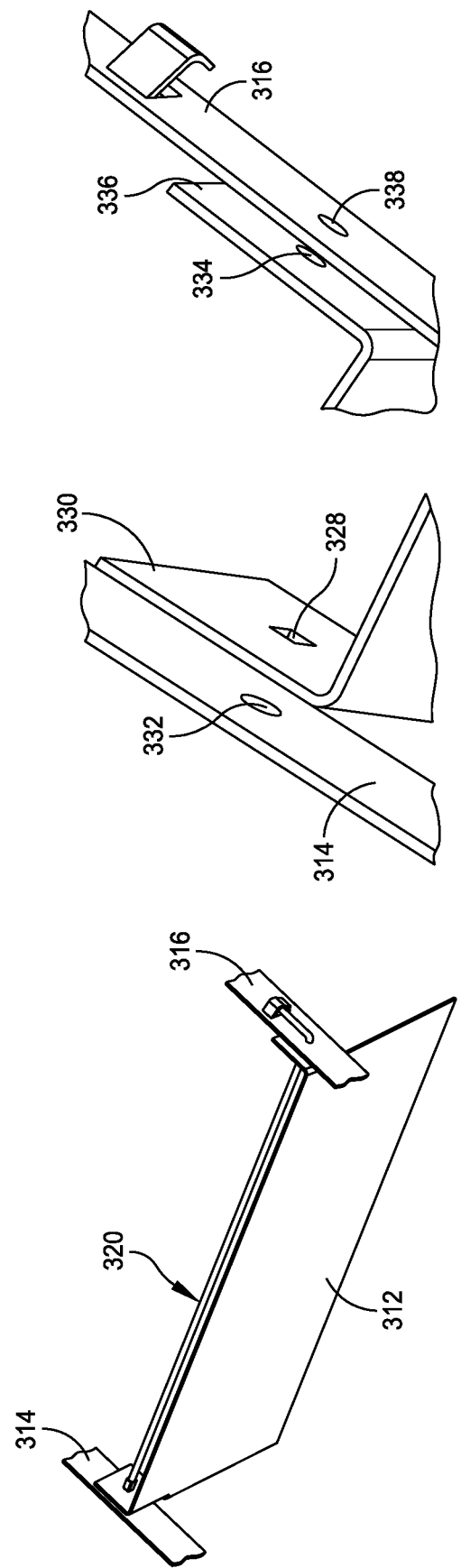

SYSTEMS AND METHODS FOR ARC FLASH INCIDENT ENERGY REDUCTION

CROSS-REFERENCE TO RELATED APPLICATION

This application claims the benefit under 35 U.S.C. § 119(e) of U.S. Provisional Patent Application No. 63/137,907 titled SYSTEMS AND METHODS FOR ARC FLASH INCIDENT ENERGY REDUCTION filed on Jan. 15, 2021, which is herein incorporated by reference in its entirety for all purposes.

BACKGROUND OF DISCLOSURE

1. Field of Disclosure

Embodiments of the disclosure relate generally to safety features, and more specifically, to a safety assembly that is used within an equipment rack to prevent arc flash events from connecting and disconnecting electronic equipment from busbars and fan modules within the equipment rack.

2. Discussion of Related Art

Centralized data centers for computer, communications and other electronic equipment have been in use for a number of years. More recently, with the increasing use of the Internet, large scale data centers that provide hosting services for Internet Service Providers (ISPs), Application Service Providers (ASPs) and Internet content providers have become increasingly popular. It is often desirable to operate equipment within data centers seven days a week, 24 hours per day, with little or no disruption in service. To prevent any disruption in service, it is common practice in data centers to use uninterruptible power supplies (UPSs) provided in equipment racks to ensure that the equipment within the data centers receives continuous power throughout any black out or brown out periods. Typically, data centers are equipped with a relatively large UPS at the main power distribution panel for the facility. Often, the UPS is selected to have sufficient capacity to meet the power requirements for all of the equipment within the facility.

The use of the UPS to provide power to a critical load is well known in the art. The UPS is designed to protect electronic equipment from utility power blackouts, brown-outs, sags and surges. The UPS may also protect electronic equipment from small utility fluctuations and large disturbances. In most rack configurations, the UPS provides battery backup until utility power returns to safe levels or the batteries are fully discharged. The configurable rack may include power distribution modules and batteries to form the UPS, and other pieces of equipment required to operate the uninterruptible power supply. These modules are rack-mounted in the well-known manner.

A typical power distribution unit consists of a rack frame chassis and removable power distribution modules or power modules for short, which are often removed for replacement or service. The power modules connect to a live busbar provided at a back of the equipment rack, and when the power module is removed, the live busbar is exposed. Often, the equipment rack includes a warning label to power down the equipment rack when working near the busbar to avoid hazards, such as arc flash, but such a label oftentimes can be ineffective. Other approaches have been tried, such as installing a blanking panel to block access to the live busbar. However, this approach, when implemented, requires additional time and parts.

Often, power modules and fan modules are removed and replaced from the equipment rack. Arc flashing can occur during such removal and replacement of such power modules and fan modules.

SUMMARY OF DISCLOSURE

One aspect of the present disclosure is directed to an assembly to contain energy from arc flash within a mounting slot of an equipment rack. In one embodiment, the assembly comprises a valve panel assembly including a first valve panel body secured to the frame members by a first hinge and a second valve panel body secured to the frame members by a second hinge. The first valve panel body and the second valve panel body are configured to rotate between closed positions and open positions.

Embodiments of the assembly further may include extending the first hinge along a top or side edge of the first valve panel body, with opposite ends of the first hinge extending through respective openings of the frame members. The second hinge may extend along a bottom edge of the second valve panel body, with opposite ends of the second hinge extending through respective openings of the frame members. The assembly further may include a spring to bias the second valve panel body to the closed position. The spring may be a coil spring that is mounted on one end of the second hinge, with the spring having one end configured to engage to the second valve panel body and another end that engages a portion of the frame members. At least one of the first hinge and the second hinge may include a torsion bar configured to bias the valve panel body in a closed position. The torsion bar may extend along an edge of the valve panel body, with the torsion bar having a bent section and a shaped section opposite the bent section, the shape section entering a shaped opening of a portion of the valve panel body to ensure that the valve panel body rotates when the torsion bar rotates. The assembly further may include a redirection plate secured to the chassis of the equipment rack. The redirection plate may be configured to direct arc flash along a plane of the redirection plate. The assembly further may include a fan shroud coupled to the chassis of the equipment rack. The fan shroud may be configured to receive a fan module to provide airflow to the electronic equipment. The fan shroud further may be configured to operate in an open position in which the fan module is received by the fan shroud and a closed position in which the fan shroud blocks arc flash when the fan module is installed or removed from the fan shroud.

Another aspect of the present disclosure is directed to a method of selectively blocking access to a portion of an equipment rack within a mounting slot of a chassis of the equipment rack with the assembly disclosed herein.

Yet another aspect of the present disclosure is directed to an equipment rack comprising a chassis, an open power source located at a back of the chassis, and a valve panel assembly including a first valve panel body secured to the frame members by a first hinge and a second valve panel body secured to the frame members by a second hinge. The first valve panel body and the second valve panel body are configured to rotate between closed positions and open positions.

Embodiments of the equipment rack further may include extending the first hinge along a top or side edge of the first valve panel body, with opposite ends of the first hinge extending through respective openings of the frame members. The second hinge may extend along a bottom edge of the second valve panel body, with opposite ends of the second hinge extending through respective openings of the frame members. The equipment rack further may include a spring to bias the second valve panel body to the closed position. The spring may be a coil spring that is mounted on one end of the second hinge, with the spring having one end configured to engage to the second valve panel body and another end that engages a portion of the frame members. The assembly further may include a redirection plate secured to the chassis of the equipment rack. The redirection plate may be configured to direct arc flash along a plane of the redirection plate. The assembly further may include a fan shroud coupled to the chassis of the equipment rack. The fan shroud may be configured to receive a fan module to provide airflow to the electronic equipment. The fan shroud further may be configured to operate in an open position in which the fan module is received by the fan shroud and a closed position in which the fan shroud blocks arc flash when the fan module is installed or removed from the fan shroud.

Another aspect of the present disclosure is directed to an assembly to contain energy from arc flash from an equipment rack. In one embodiment, the assembly comprises a redirection plate secured to a chassis of an equipment rack, the redirection plate being configured to direct arc flash along a plane of the redirection plate.

Another aspect of the present disclosure is directed to an equipment rack comprising a chassis, an open power source located at a back of the chassis, and a redirection plate secured to the chassis, the redirection plate being configured to direct arc flash along a plane of the redirection plate.

Another aspect of the present disclosure is directed to an assembly to contain energy from arc flash from an equipment rack. In one embodiment, the assembly comprises a fan shroud coupled to an equipment rack configured to support electronic equipment. The fan shroud is configured to receive a fan module to provide airflow to the electronic equipment. The fan shroud further is configured to operate in an open position in which the fan module is received by the fan shroud and a closed position in which the fan shroud blocks arc flash when the fan module is installed or removed from the fan shroud.

Another aspect of the present disclosure is directed to an equipment rack comprising a chassis, an open power source located at a back of the chassis, a fan module configured to be releasably coupled to the chassis, and a fan shroud coupled to the chassis configured to support electronic equipment. The fan shroud is configured to receive a fan module and to provide airflow from the fan module to the electronic equipment. The fan shroud further is configured to operate in an open position in which the fan module is received by the fan shroud and capable of providing airflow to the electronic equipment and a closed position in which the fan shroud blocks arc flash when the fan module is installed or removed from the fan shroud.

Another aspect of the present disclosure is directed to an assembly to contain energy from arc flash from an equipment rack. In one embodiment, the assembly comprises a fan shroud coupled to an equipment rack configured to support electronic equipment. The fan shroud is configured to receive a fan module. The fan shroud further is configured to operate in an open position in which the fan module is received by the fan shroud and a closed position in which the fan shroud blocks arc flash.

Another aspect of the present invention is directed to an equipment rack comprising a chassis, a power source located at a back of the chassis, a fan module configured to be releasably coupled to the chassis, and a fan shroud coupled to the chassis. The fan shroud is configured to receive a fan module. The fan shroud further is configured to operate in an open position in which the fan module is received by the fan shroud and a closed position in which the fan shroud blocks arc flash.

Another aspect of the present disclosure is directed to a method of assembling a system to contain energy from arc flash within a mounting slot of an equipment rack. In one embodiment, the method comprises: hingedly mounting a first valve panel body to a frame of the equipment rack by a first hinge; and hingedly mounting a second valve panel body to the frame of the equipment rack by a second hinge. The first valve panel body and the second valve panel body are configured to rotate between closed positions open positions.

Embodiments of the method further may include extending the first hinge along a top or side edge of the first valve panel body and extending the second hinge along a bottom edge of the second valve panel body. Hingedly mounting the first valve panel body to the frame of the equipment rack includes securing the first hinge to the frame by a first bracket and hingedly mounting the second valve panel body to the frame of the equipment rack includes securing the second hinge to the frame by a second bracket. The method further may include a spring to bias the movement of the second valve panel body to the closed position. The spring may be a coil spring that is mounted on one end of the second hinge. The spring has one end configured to engage to the second valve panel body and another end that engages a portion of the chassis. The method further may include securing a redirection plate to the chassis of the equipment rack, the redirection plate being configured to direct arc flash along a plane of the redirection plate. The further may include a fan shroud coupled to the equipment rack. The fan shroud may be configured to receive a fan module to provide airflow to the electronic equipment. The fan shroud further may be configured to operate in an open position in which the fan module is received by the fan shroud and a closed position in which the fan shroud blocks arc flash when the fan module is installed or removed from the fan shroud.

BRIEF DESCRIPTION OF DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the disclosure. In the figures, identical or nearly identical components illustrated in various figures may be represented by like numerals. For purposes of clarity, not every component may be labeled in every figure. In the drawings:

FIGS. 6A-6C are views showing a top valve panel assembly of an embodiment of the present disclosure;

FIGS. 33A-33C are perspective views of the torsion bar showing aspects of the torsion bar;

FIGS. 34A-34C are perspective views of a flap valve assembly of an embodiment of the present disclosure showing frame members used to support a torsion bar;

DETAILED DESCRIPTION

Figure 1:
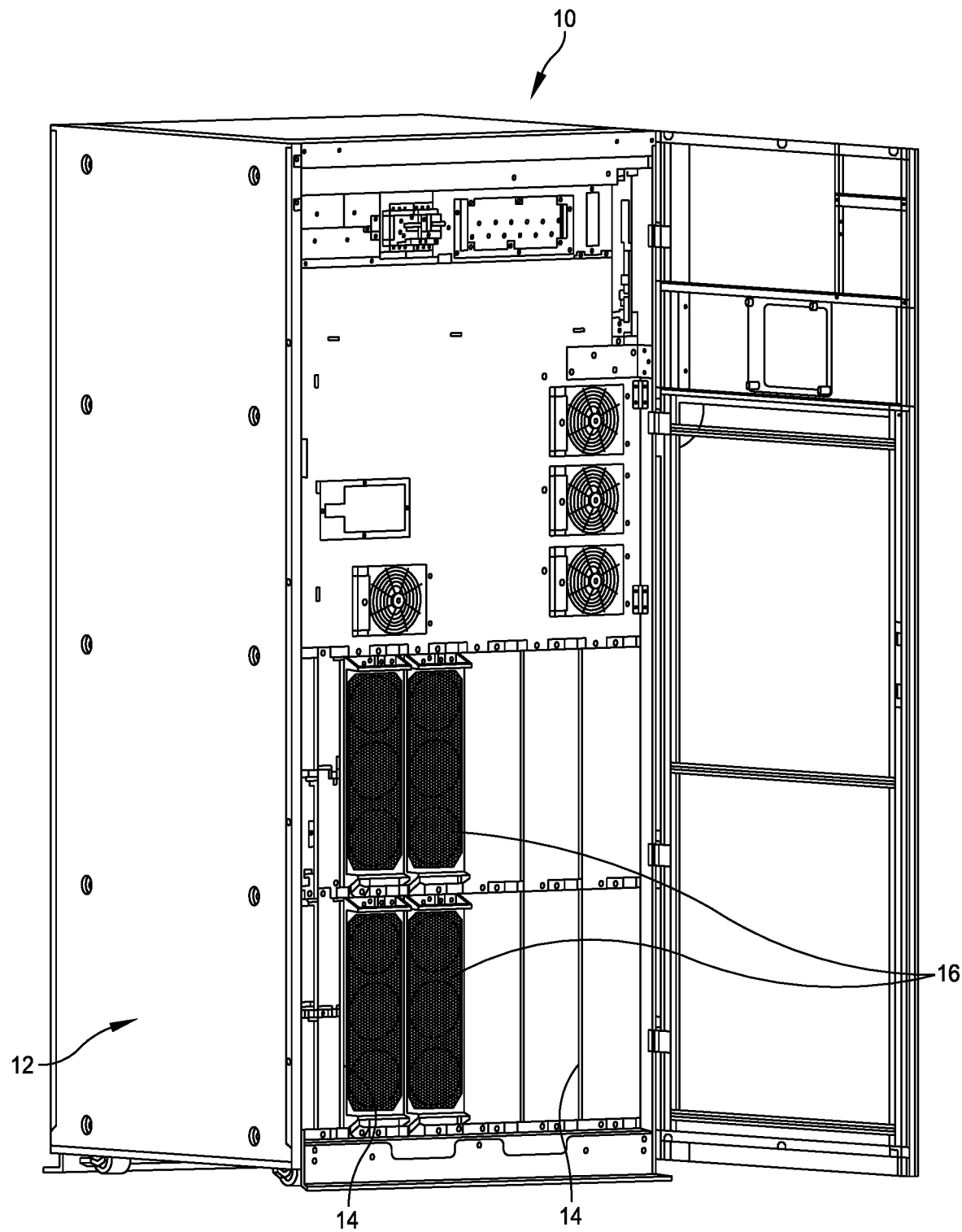
FIG. 1 is a perspective view of a standard equipment rack.

This disclosure is not limited in its application to the details of construction and the arrangement of components set forth in the following description or illustrated in the drawings. The principles set forth in this disclosure are capable of being provided in other embodiments and of being practiced or of being carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Mission-critical applications such as data centers, hospitals, airports, and military require high-availability power supply. One means of improving power availability is through modular design, which reduces mean time to recover (MTTR). For example, replacing a failed module in a UPS decreases recovery time while eliminating the downtime risk of transferring to bypass. This practice involves the ability to replace modules in any mode of operation. In addition to UPS, other low-voltage electrical equipment offered can be removed and replaced, such as cooling modules (e.g., fan modules), tap units on energized busway and circuit breaker modules on energized switchboard.

During such replacements, arc flash can occur. Specifically, energized-swapping activities can pose electrical hazards, such as shock and arc flash, to operators performing such replacements. A shock hazard may occur when the operator approaches energized electric conductors or circuit parts. The operator may inadvertently touch the part, i.e., due to disturbances, stumbling, or when in close proximity to de-energized parts. An arc flash may result when a fault occurs between two live conductors. Sources of an arc flash can be foreign elements, such as tools or dust/debris, defect or worn-down insulation material, poor design, poor installation, to name a few. Arc flash can be measured based on incident energy released through the air in the form of heat, sound, light, and explosive pressure, all of which can cause harm. Some specific injuries can include burns, blindness, electric shock, hearing loss, and fractures.

The present disclosure is directed to an assembly having valve panels that are configured to contain energy from arc flash, especially during replacements. Embodiments of the assembly disclosed herein are provided to ensure touch safety through the entire sequence of replacement. In some embodiments, the assembly is configured to limit potential arc flash incident energy to under 1.2 calories/cm².

Flap Valves

Embodiments of the present disclosure are directed to valve panels that are operated by gravity or spring loaded to fall down or spring up respectively when a power module is removed from an equipment rack. The valve panels are provided to assist in reducing available incident energy below a tested threshold through all stages of a power module swapping.

Embodiments of the valve panels of the present disclosure enable no risk of touching the busbar and no increased risk of arc flash.

Embodiments of the valve panels of the present disclosure achieve arc incident energy reduction, which simplifies the design considerably.

Figure 2:
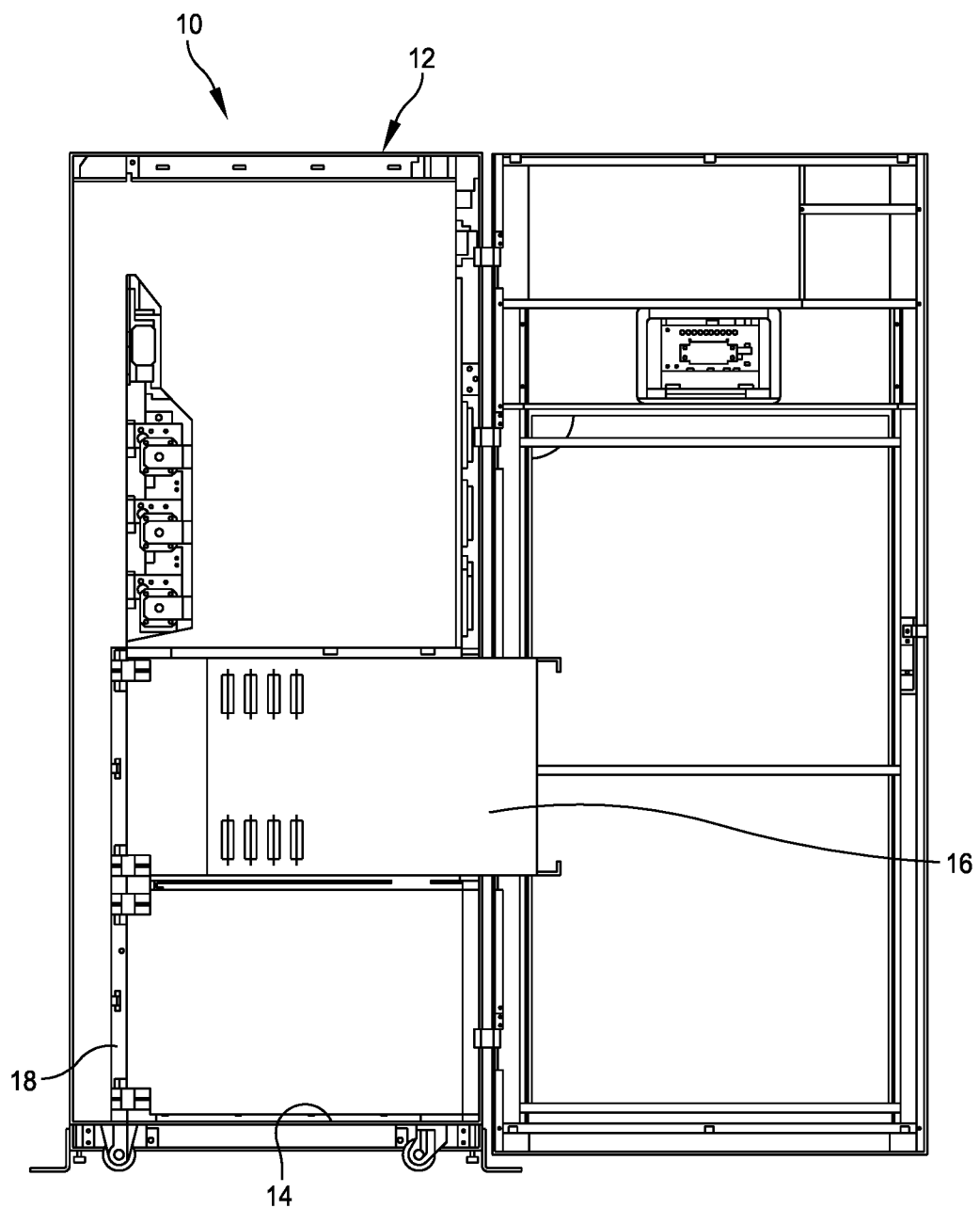
FIG. 2 is an elevational cross-sectional view of the equipment rack.

Referring to FIGS. 1 and 2, an equipment rack or rack enclosure, generally indicated at 10, is constructed in the well-known manner. In one embodiment, the equipment rack 10 includes a chassis, or frame structure, generally indicated at 12, that defines an enclosure. In one embodiment, the equipment rack 10 includes a door, which is shown in the drawings in an open position. The chassis 12 includes an open front having several mounting slots, each indicated at 14, that are each configured to slidably receive electronic components, such as power modules, each indicated at 16. Once installed, the power modules 16 engage a busbar 18 (FIG. 2) provided at a back of the chassis 12 in the well-known manner to provide power to the power modules. Although a busbar 18 is shown, the chassis 12 of the rack enclosure may include live wire provided to power equipment housed within the equipment rack, including the power modules 16.

The exemplary equipment rack 10 shown in FIGS. 1 and 2 illustrate power modules 16 installed within respective mounting slots 14 provided in the equipment rack 10, with empty slots being covered by blanking panels. It should be noted that the equipment rack 10 can be configured to accommodate any number of power modules 16, with the size of the mounting slots being dependent on the size of the power modules received within the mounting slots. In particular, the equipment rack 10 includes multiple mounting slots 14, sometimes called bays, with each bay being configured to hold the power module 16 in place. As shown, the power modules 16 provided within the equipment rack 10 are stacked one above and adjacent one another; however, the equipment rack can be configured so that the power modules are oriented and positioned in any desired configuration.

In one embodiment, once installed, the power module 16 engages the busbar 18 to provide power to the power module. As mentioned above, the power module 16 can be removed from its respective mounting slot 14 to replace the power module or to repair the power module. Once removed, unless blocked off by a blanking panel mounted on a front surface of the equipment rack in front of the mounting slot 14 or within an interior of the equipment rack 10, an operator or other person is able to access the busbar 18, which can be dangerous if the operator is not careful.

Figure 3:
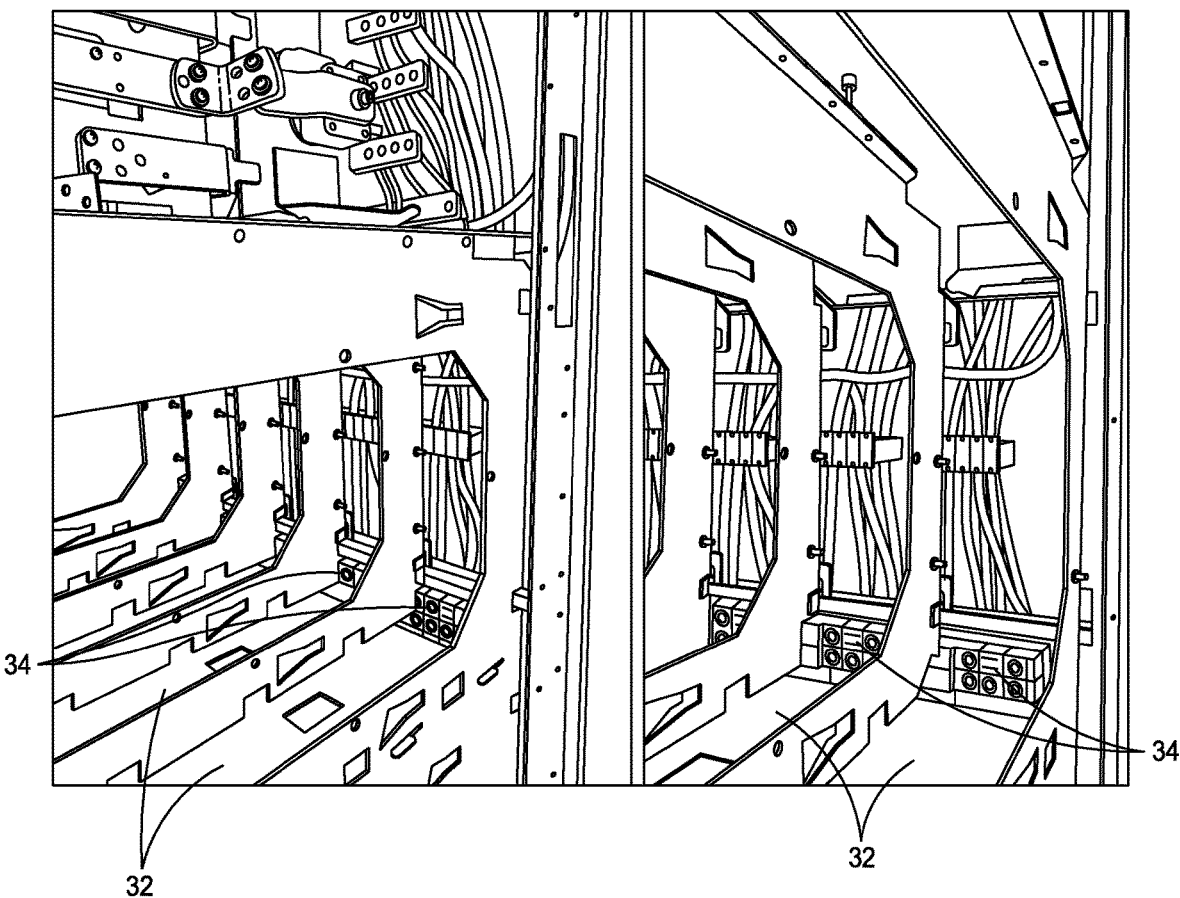
FIG. 3 is an enlarged perspective view of an interior of the equipment rack.

Referring to FIG. 3, a portion of an interior of the equipment rack 10 is shown to disclose several mounting slots, each indicated at 32. As shown, each mounting slot 32 includes a dead front barrier to an upper compartment, double insulated cables, and a connector 34 that is reinforced to be touch proof. A dead front barrier means that the equipment rack at the front is without live parts exposed to a person on the operating side of the equipment.

Figure 4:
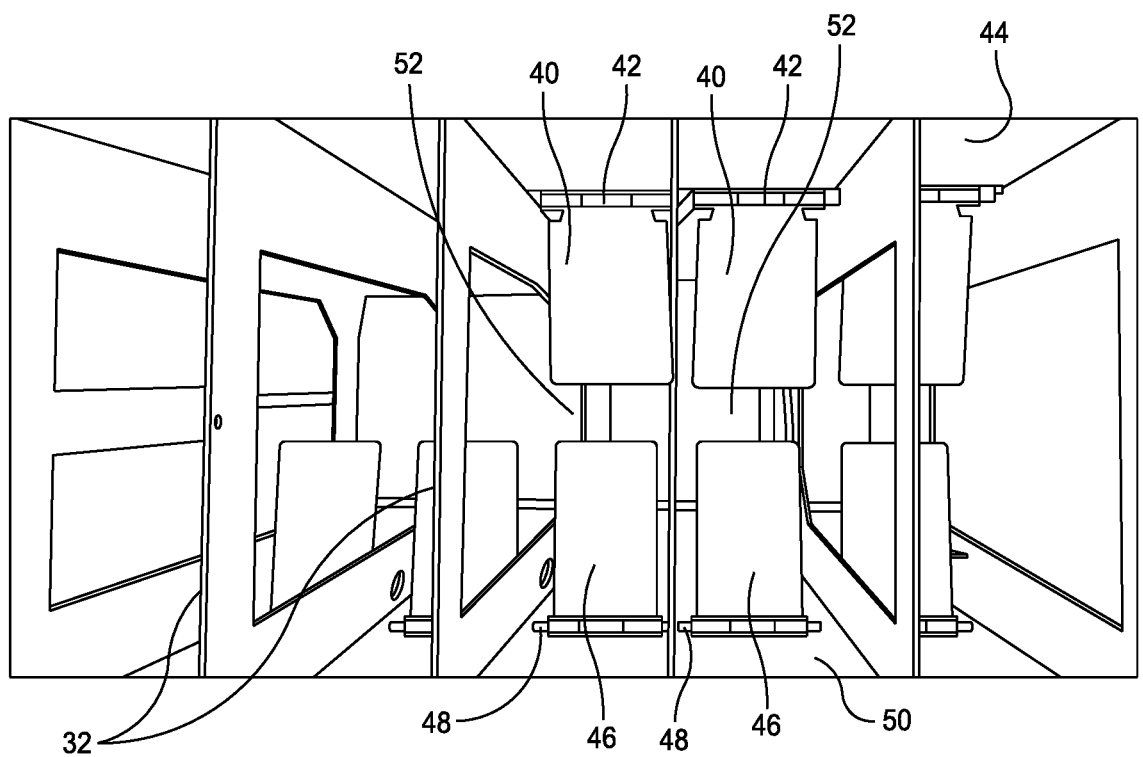
FIG. 4 is an enlarged front view of mounting slots of the equipment rack.

Referring to FIG. 4, valve panel assemblies of embodiments of the present disclosure are provided to contain energy from arc flash within a mounting slot 32 of an equipment rack. As shown, a first (top) valve panel assembly includes a top panel body 40 hingedly mounted by hinge 42 to a top wall 44 defining the mounting slot 32. A second (bottom) valve panel assembly includes a bottom panel body 46 hingedly spring-mounted by hinge 48 to a bottom wall 50 defining the mounting slot 32. The top panel body 40 of the first valve panel assembly is vertically oriented because of gravity, while the bottom panel body 46 of the second valve panel assembly is vertically oriented because of a spring mechanism associated with the hinge 48 of the bottom panel body, which will be described in detail below. As shown, a bottom edge of the top panel body 40 of the first valve panel assembly is spaced from a top edge of the bottom panel body 46 of the second valve panel assembly to define a gap 52. The gap 52 between the bottom edge of the top panel body 40 of the first valve panel assembly and the top edge of the bottom panel body 46 of the second valve panel assembly can be varied based on the application. In one embodiment, the gap 52 provides a release for air pressure build up caused by an arc flash.

Figure 5:
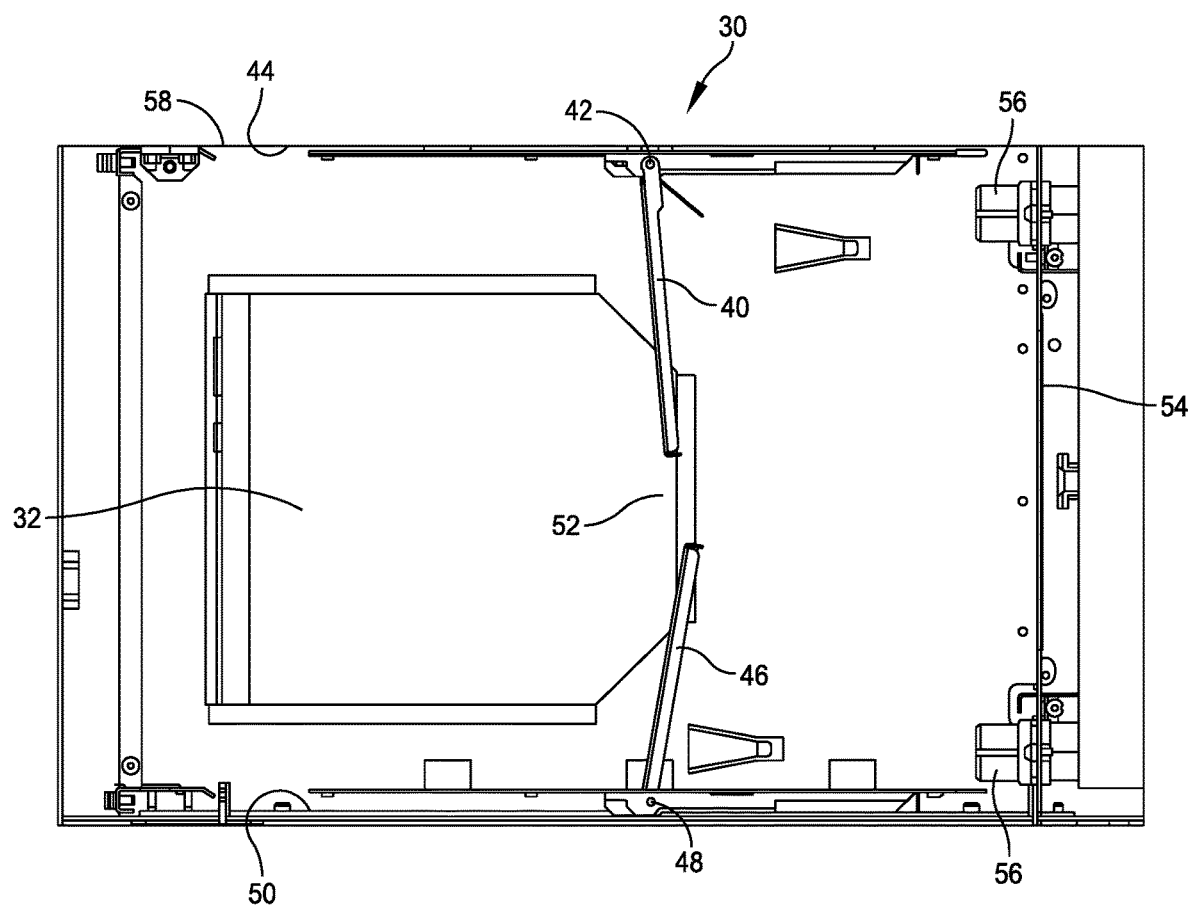
FIG. 5 is a schematic elevational cross-sectional view of valve panel assemblies provided within a mounting slot.
Figure 7A:
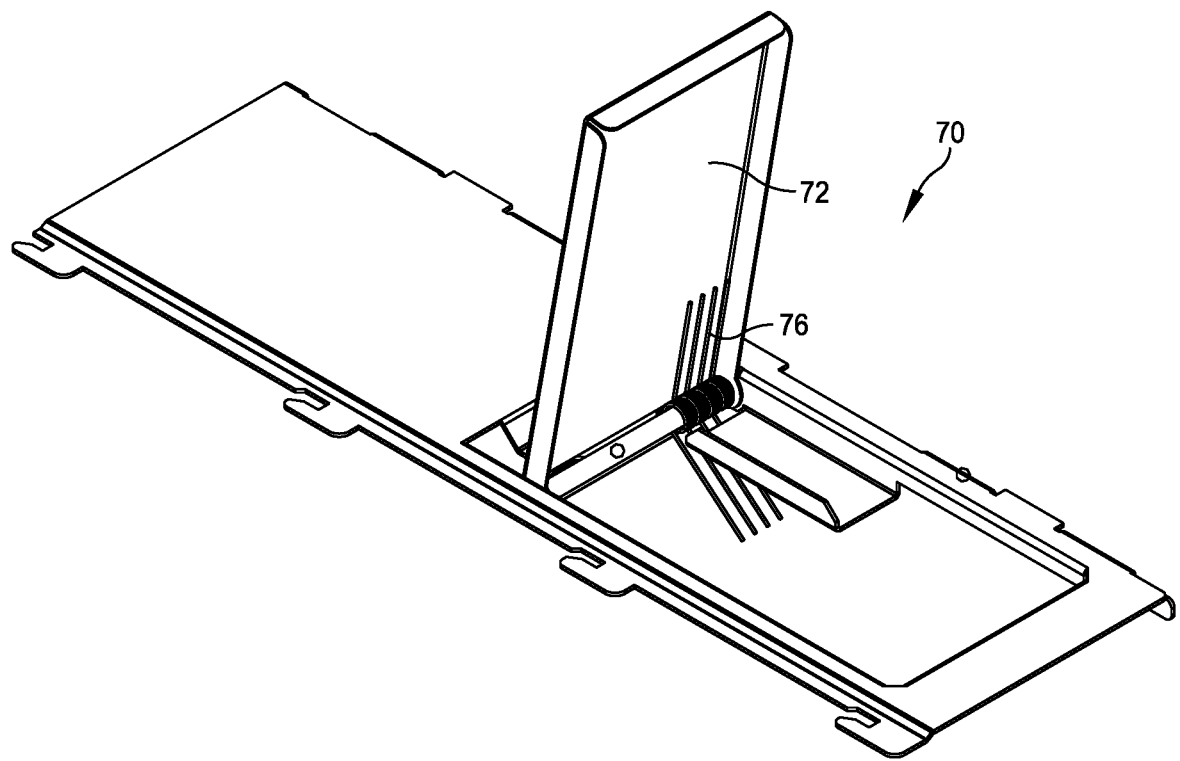
FIGS. 7A-7D are views showing a bottom valve panel assembly of an embodiment of the present disclosure.
Figure 7B:
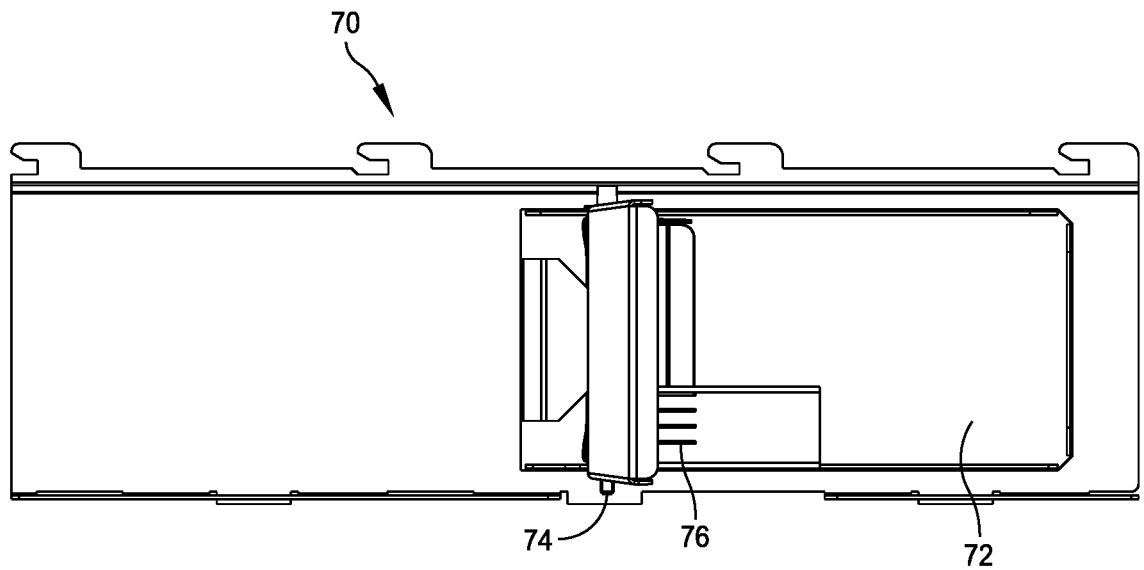
Figure 7C:
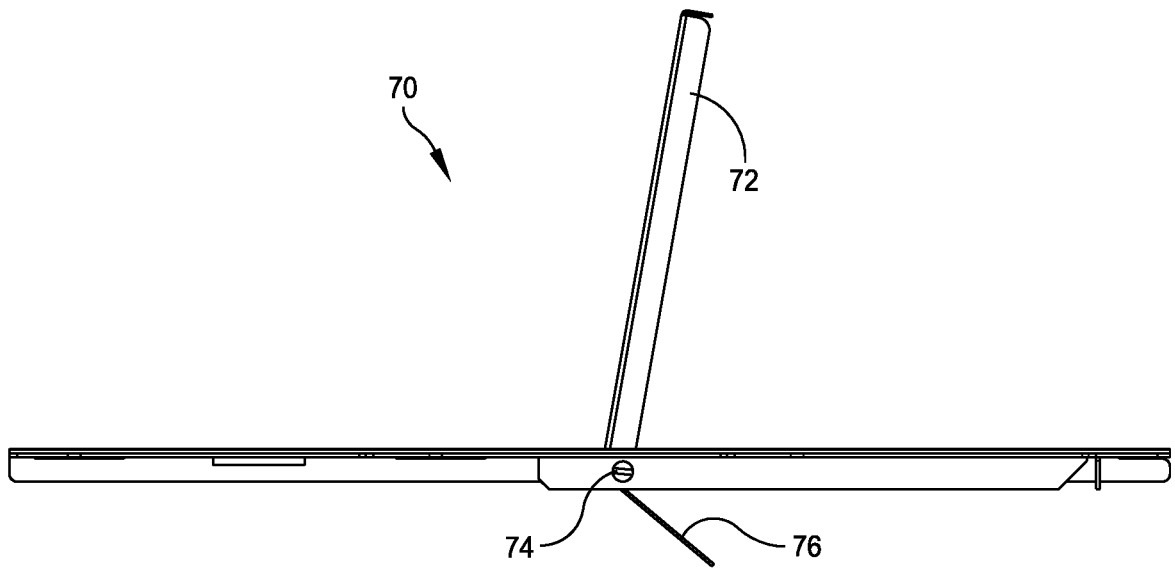
Figure 7D:
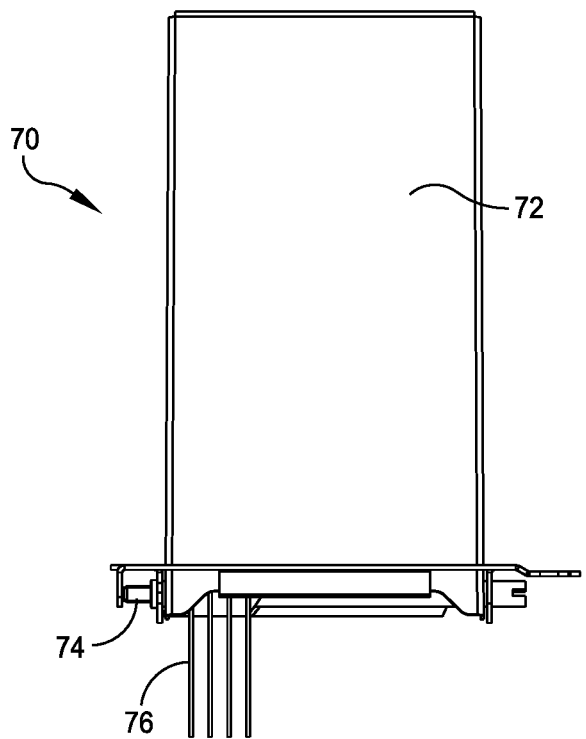
Figure 8A:
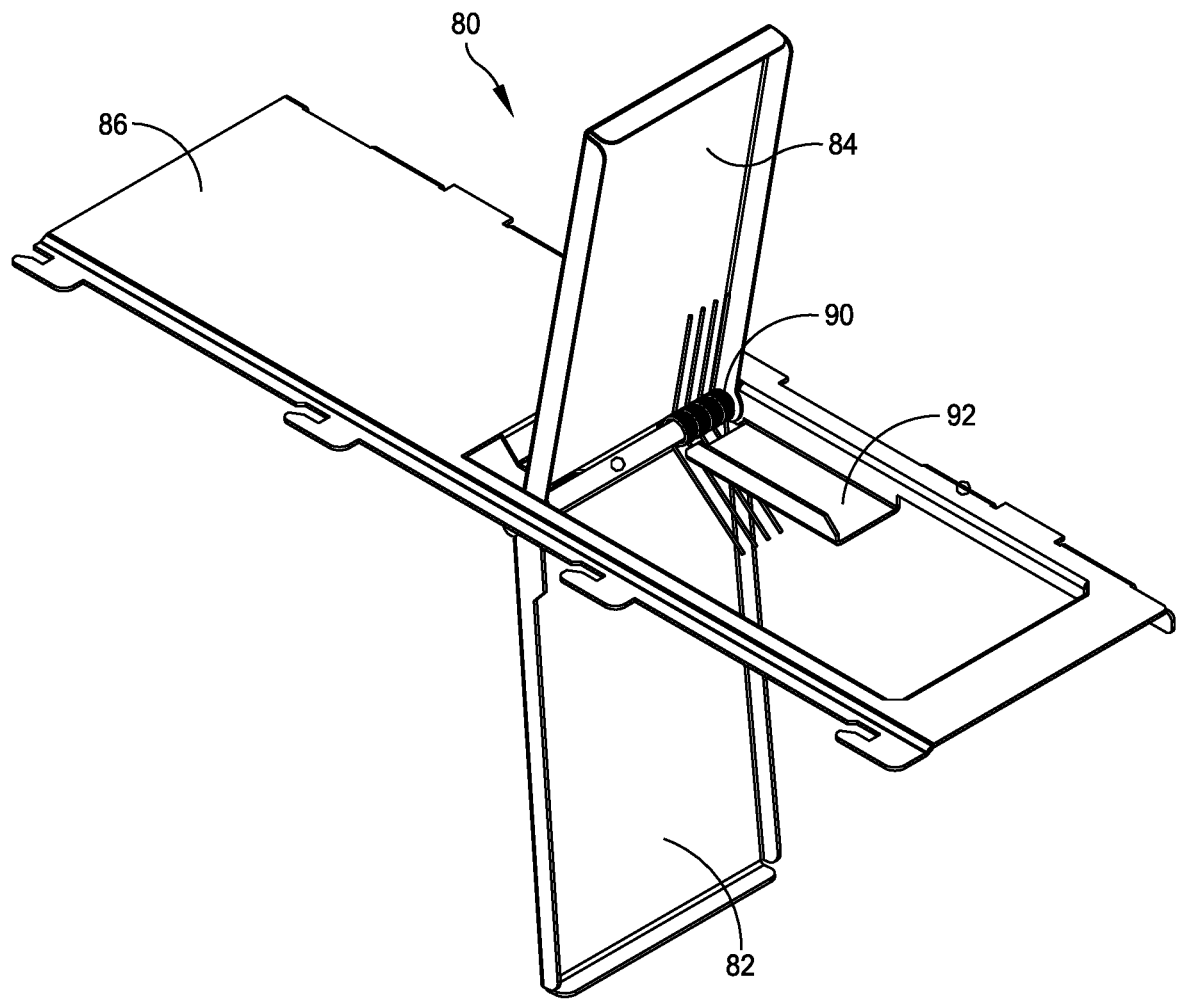
FIGS. 8A-8D are views showing a combination valve panel assembly of an embodiment of the present disclosure.
Figure 8B:
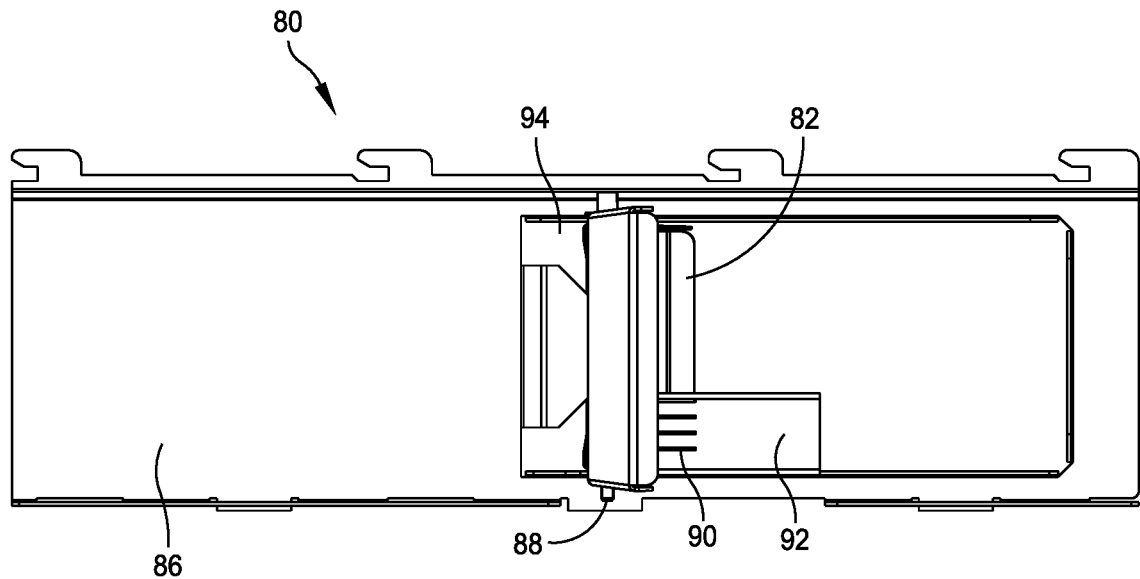
Figure 8C:
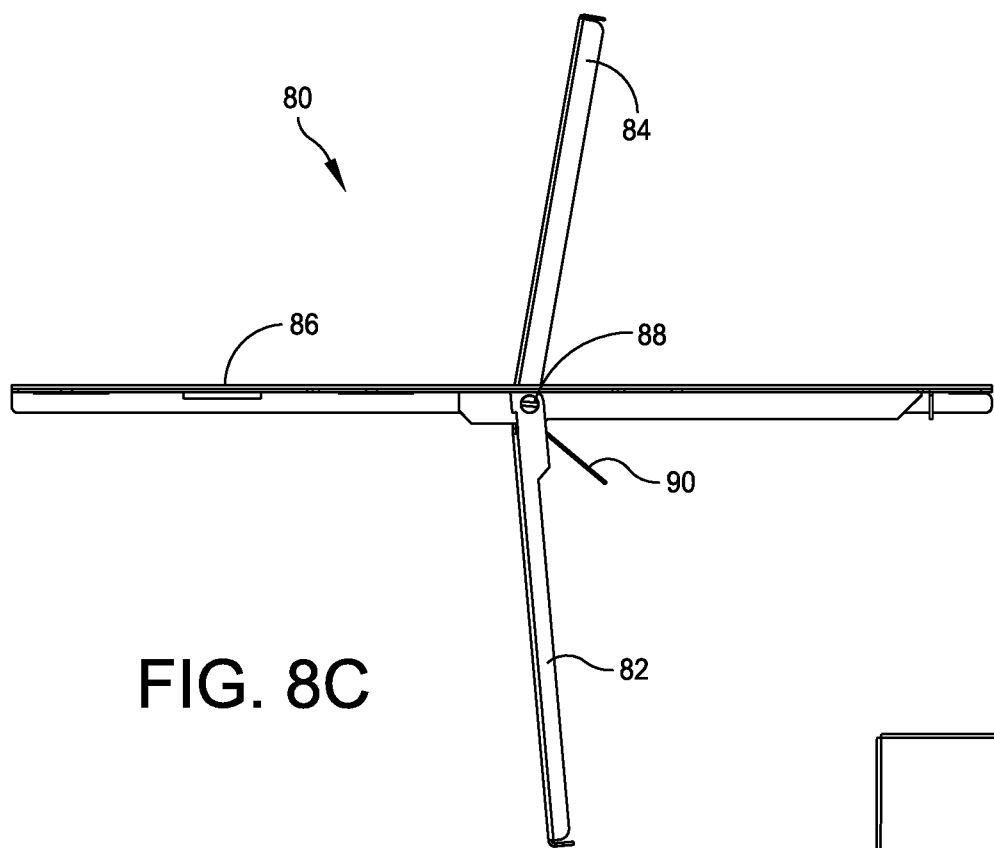
Figure 8D:
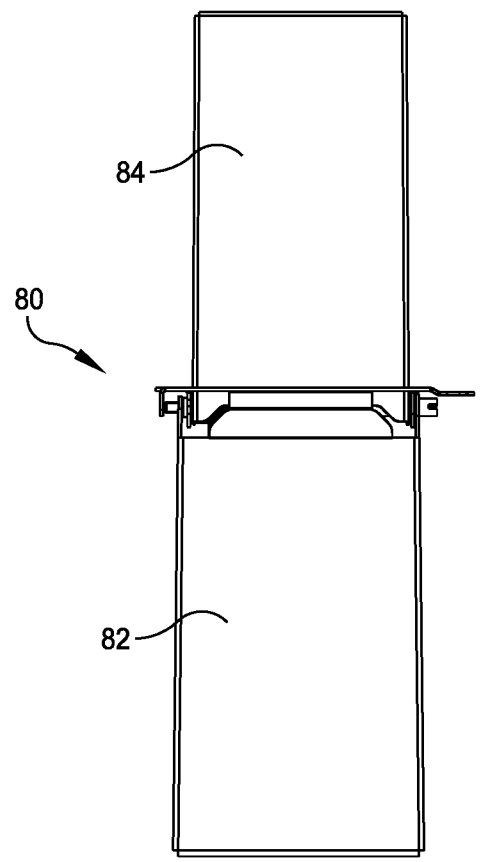

Referring to FIG. 5, the first (top) and second (bottom) valve panel assemblies are shown prior to inserting a power module into the mounting slot 32. As shown, a busbar 54 includes two interface connectors, each indicated at 56, which are used to connect the power module to the busbar. In one embodiment, the interface connectors 56 are touch "safe" in that an operator can touch or otherwise handle the connectors. The equipment rack further includes cables at the back of the equipment rack that connect to an input/output section provided above the mounting slot 32. A steel plate 58 is provided to prevent an arc from propagating between the input/output section and the mounting slot 32, indicated as the "power module cavity" in FIG. 5. The top and bottom valve panel assemblies, which are indicated as "flapper valves" in FIG. 5, provide protection against arc when removing a power module from the mounting slot 32.

FIGS. 6A-6C illustrate an embodiment of the top valve panel assembly, generally indicated at 60, which is designed to hang down from the top wall of the mounting slot. In one embodiment, the top valve panel assembly 60 includes a top panel body 62 that is mounted to the top wall of the mounting slot by a bracket 64. The top valve panel assembly 60 further includes a hinge 66 in the form of a pin to hingedly secure the top panel body to the bracket 64. The top panel body 62 is formed by folding over side and end edges, with the side edges having openings formed therein to receive the hinge 66. Since the top valve panel assembly 60 is mounted to the top wall of the mounting slot, the top panel body 62 of the top valve panel assembly is normally disposed in a vertical position.

FIGS. 7A-7D illustrate an embodiment of the bottom valve panel assembly, generally indicated at 70, which is designed to move from a biased vertical position to a generally horizontal position. In one embodiment, the bottom valve panel assembly 70 includes a bottom panel body 72 that is mounted to the bottom wall of the mounting slot. The bottom wall of the mounting slot is specifically configured to secure the bottom panel body 72 to the bottom wall. The bottom valve panel assembly 70 further includes a hinge 74 in the form of a pin to hingedly secure the bottom panel body to the bottom wall. The bottom valve panel assembly 70 further includes one or more coil springs together indicated at 76, which are provided to bias the bottom panel body 72 in a vertical position. One free end of each spring 76 is positioned to engage the bottom panel body 72 and an opposite free end of each spring is positioned engaging a portion of the bottom wall of the mounting slot.

FIGS. 8A-8D illustrate a combination top and bottom valve panel assembly, generally indicated at 80, which is disposed between top and bottom adjacent mounting slots. As shown, the combination valve panel assembly 80 includes top panel body 82 and a bottom panel body 84, with the top panel body being positioned below the bottom panel body since the top panel body operates within the bottom mounting slot and the bottom panel body operates within the top mounting slot. The top panel body 82 and the bottom panel body 84 are secured to a shelf 86 disposed between two mounting slots. In one embodiment, the shelf 86 is configured with an opening providing access to the top panel body 82 and the bottom panel body 84. The combination valve panel assembly 80 further includes a hinge 88, which is secured to the shelf by openings formed in the shelf 86. The hinge 88 is configured to hingedly secure the top panel body 82 and the bottom panel body 84 to the shelf 86.

As with the top panel body 62 of the top valve panel assembly 60 shown in FIGS. 6A-6C, the top panel body 82 of the combination valve panel assembly 80 is free to hang from the hinge 88. As with the bottom panel body 72 of the bottom valve panel assembly 70 shown in FIGS. 7A-7D, the bottom panel body 84 is biased by one or more springs together indicated at 90 to the vertical position. The springs 90 are preloaded by sliding one end of each spring to engage the bottom panel body 84 of the combination valve panel assembly 80 and an opposite end of each spring to engage a base resting surface 92 of the shelf 86. The shelf 86 further includes a stopping element 94 for limiting movement of the top valve panel and the bottom valve panel.

Figure 9:
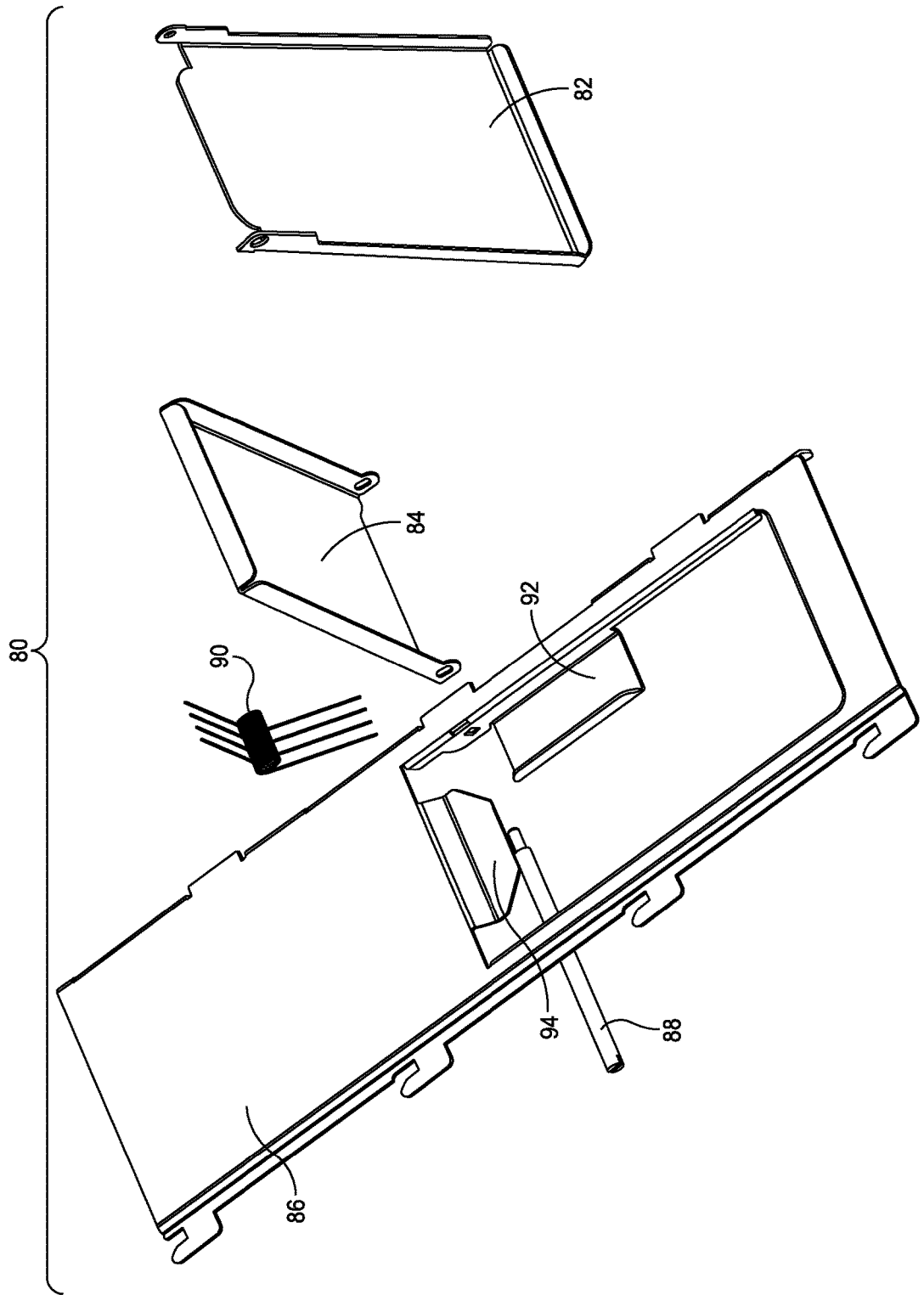
FIG. 9 is an exploded perspective view of the combination valve panel assembly.
Figure 10:
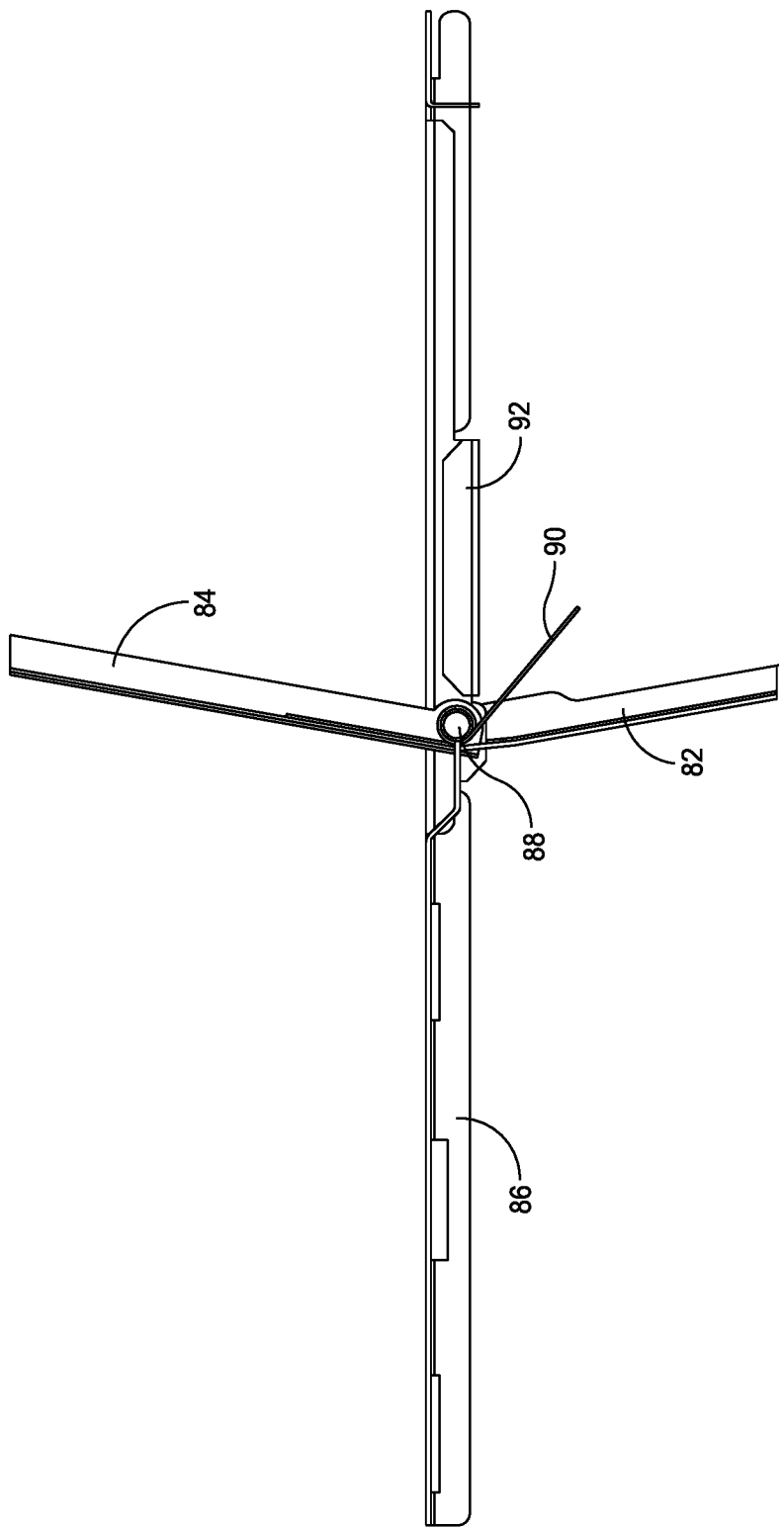
FIG. 10 is a cross-sectional view of the combination valve panel assembly.

FIG. 9 illustrates an exploded perspective view of the combination valve panel assembly 80 shown in FIGS. 8A-8D. As shown, the combination valve panel assembly 80 includes the top panel body 82, the bottom panel body 84, the hinge 88 and the spring 90, which together are assembled to the shelf 86. FIG. 10 illustrates a cross-sectional view of the combination valve panel assembly 80.

Figure 11:
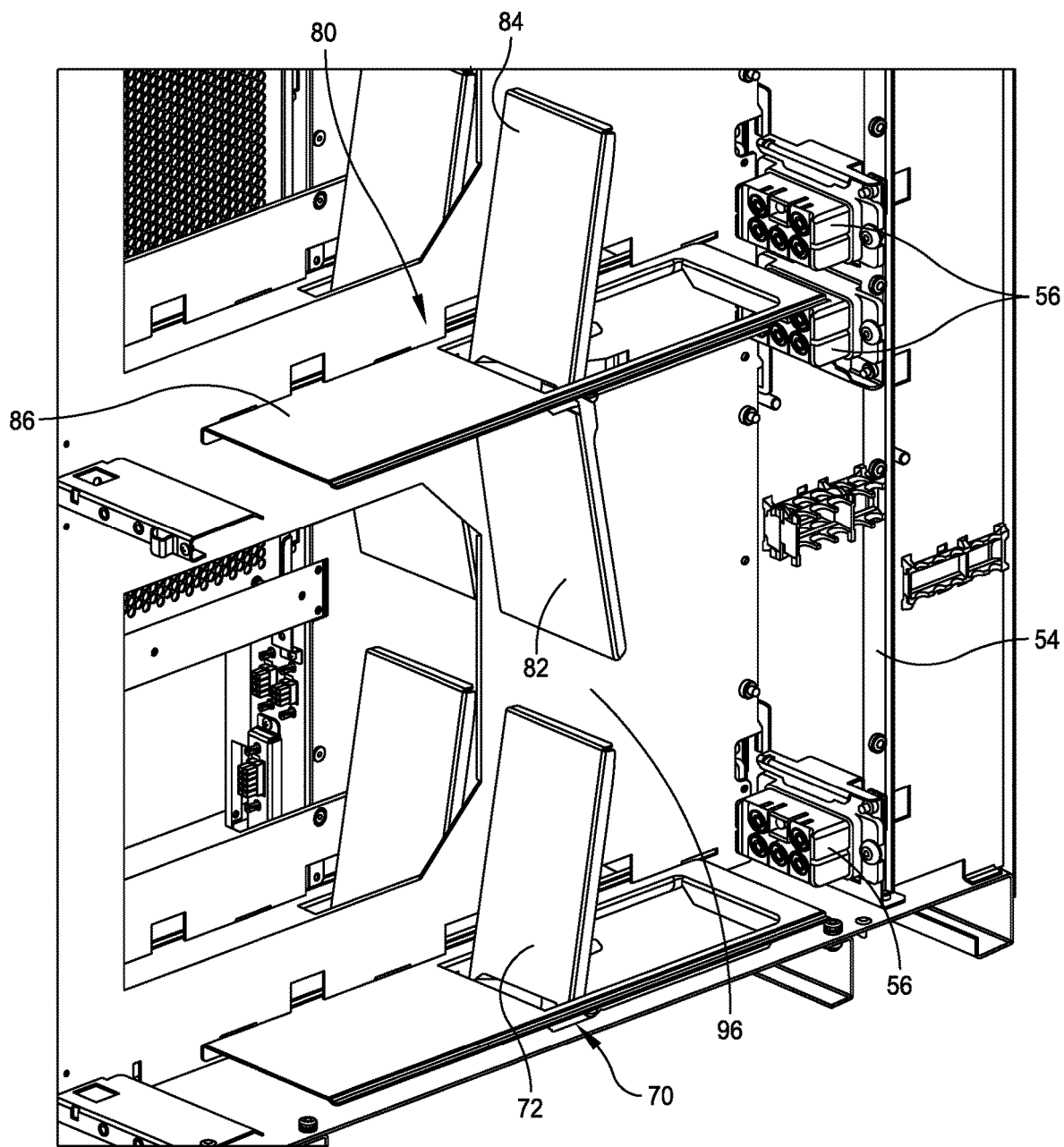
FIG. 11 is a perspective view of bottom valve panel assemblies and combination valve panel assemblies within the equipment rack.

FIG. 11 illustrates the bottom valve panel assembly 70 and the combination valve panel assembly 80 in a position prior to receiving power modules within mounting slots, each indicated at 110, of the equipment rack 112. The bottom panel body 72 of the bottom valve panel assembly 70 is oriented in the biased generally vertical position. The top panel body 82 of the combination valve panel assembly 80 is disposed in a free hanging, vertical position. A gap 96 is shown between the bottom panel body 72 of the bottom valve panel assembly 70 and the top panel body 82 of the combination valve panel assembly 80. The gap 92 is configured to provide a release for air pressure build up caused by an arc flash.

Figure 12:
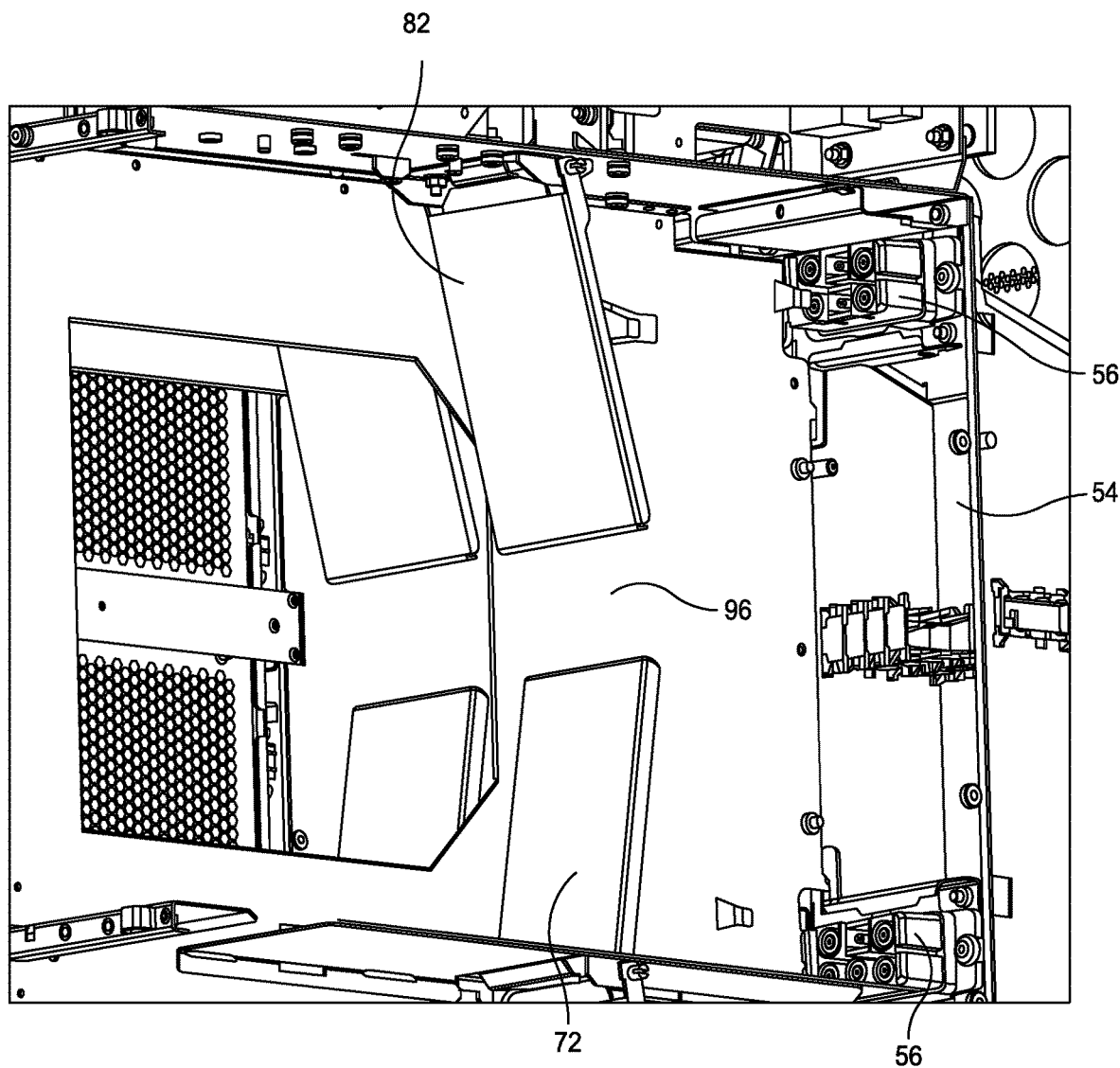
FIG. 12 is a perspective view of top valve panel assemblies and combination valve panel assemblies within the equipment rack.

FIG. 12 illustrates the combination valve panel assembly 80 and the top valve panel assembly 60 in a position prior to receiving power modules within the mounting slots 110 of the equipment rack 112. The bottom panel body 84 of the combination valve panel assembly 80 is oriented in the biased generally vertical position. The top panel body 62 of the top valve panel assembly 62 is disposed in a free hanging, vertical position.

Figure 13:
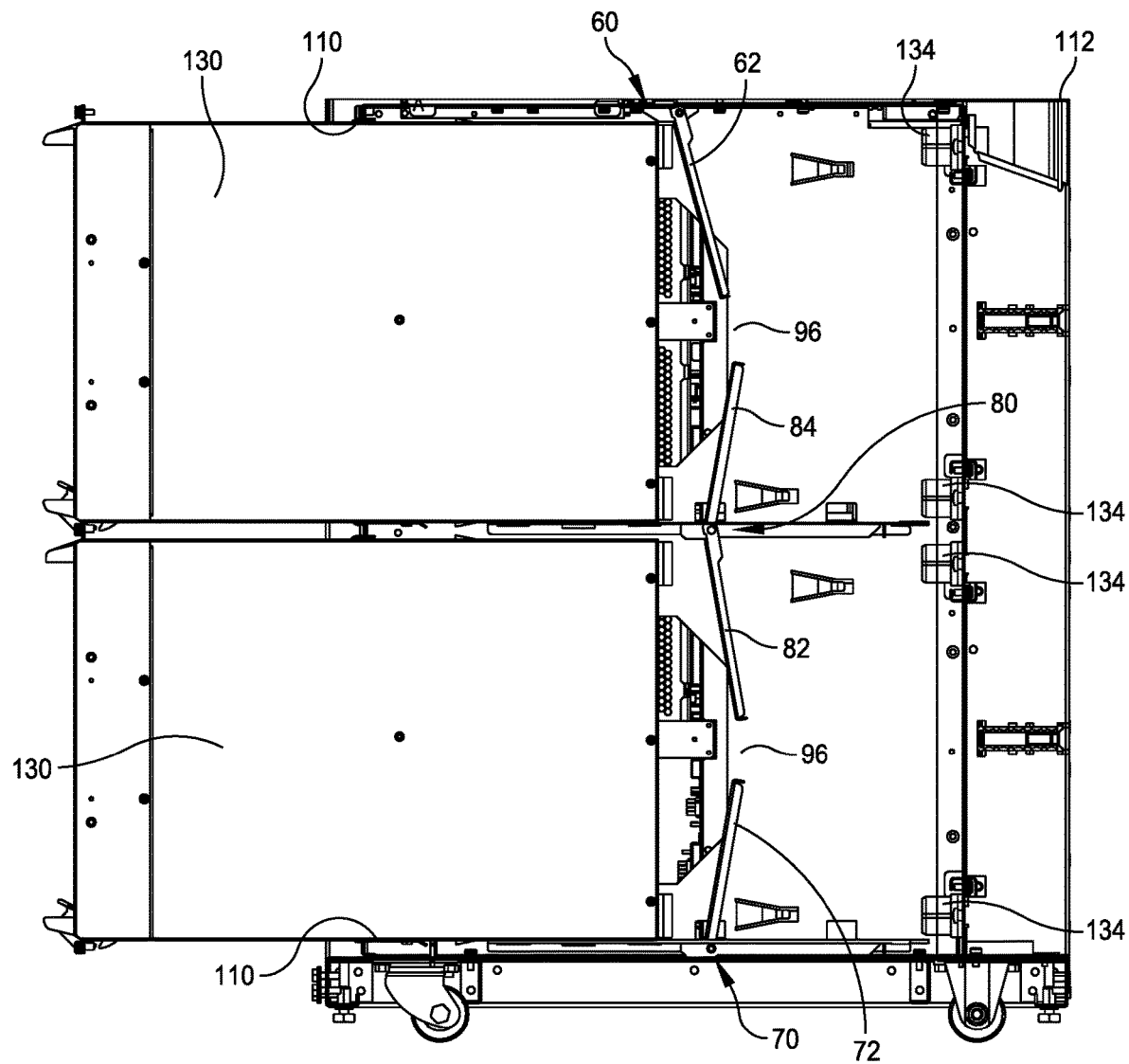
FIG. 13 is an elevational cross-sectional view of power modules being inserted into respective mounting slots of the equipment rack.

FIG. 13 illustrates power modules, each indicated at 130, being inserted into respective mounting slots 110 of the equipment rack 112. As shown, the power modules 130 are illustrated prior to reaching the top valve panel assembly 60, the bottom valve panel assembly 70 and the combination valve panel assembly 80. In one embodiment, the valve panel assemblies 60, 70, 80 are shown to be positioned closer to a busbar 132 and a back of the equipment rack 112 than a front of the equipment rack to be closer to the arc should an arc be generated when removing the power modules. The top panel bodies 62, 82 and the bottom panel bodies 72, 84 are disposed in their respective vertical positions.

Figure 14:
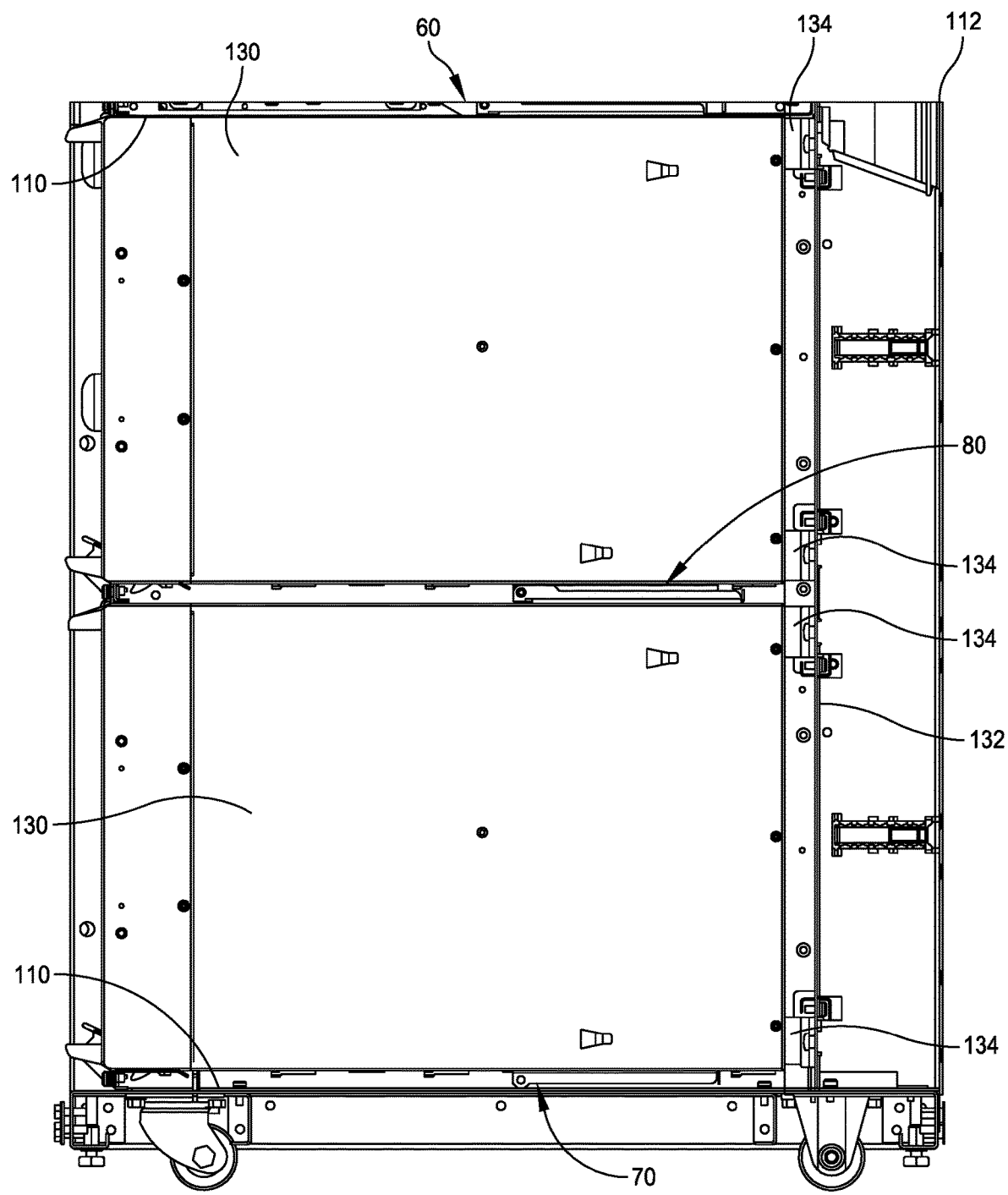
FIG. 14 is an elevational cross-sectional view of power modules fully inserted into respective mounting slots of the equipment rack.

FIG. 14 illustrates power modules 130 fully inserted into respective mounting slots 110 of the equipment rack 112. As shown, the power modules 130 are illustrated in positions in which they are mechanically and electrically coupled to interface connectors, each indicated at 134, associated with the busbar 132. The top panel bodies 62, 82 and the bottom panel bodies 72, 84 are disposed in their respective horizontal positions to enable the power modules 130 to be fully received within their respective mounting slots 110.

Figure 15:
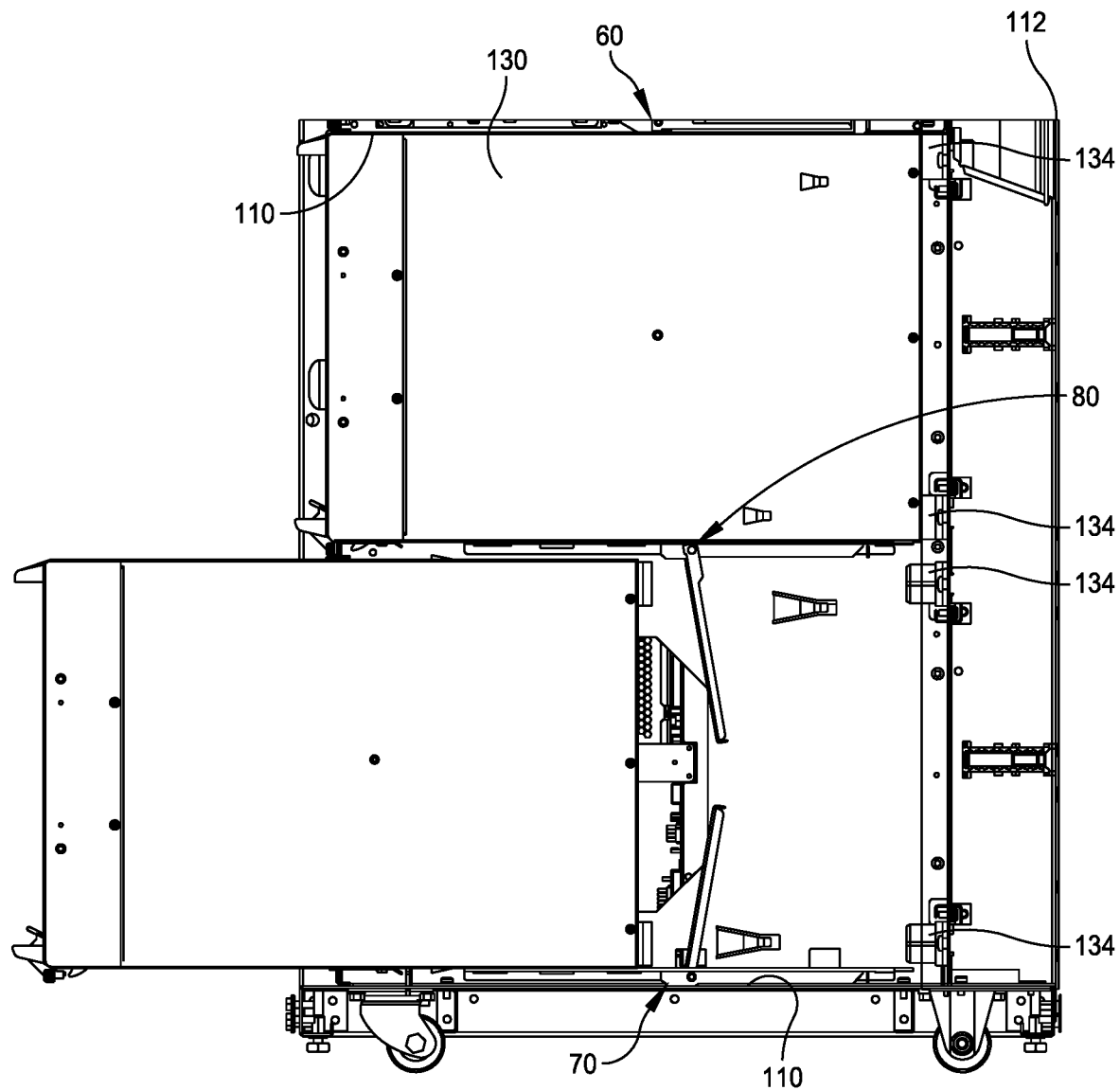
FIG. 15 is an elevational cross-sectional view of an upper power module being fully inserted into its respective mounting slot and a lower power module being inserted into or extracted from its respective mounting slot.
Figure 16:
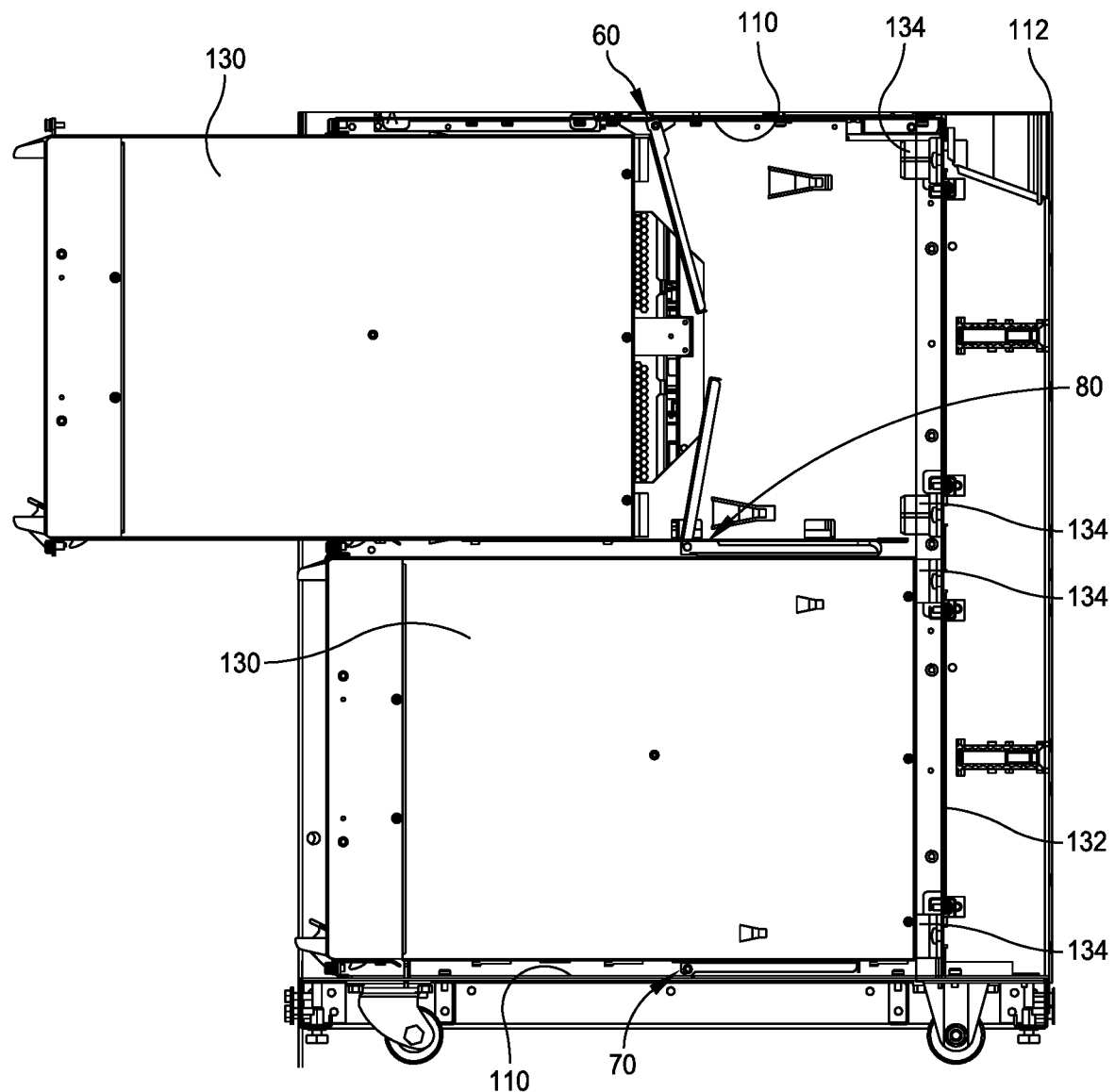
FIG. 16 is an elevational cross-sectional view of an upper power module being inserted into or extracted from its respective mounting slot and a lower power module being fully inserted into its respective mounting slot.

It should be understood that the power modules 130 can be inserted into and extracted out of their respective mounting slots 110 independently from one another. For example, FIG. 15 illustrates an upper power module 130 being fully inserted into its respective mounting slot 110 and a lower power module 130 being inserted into or extracted from its respective mounting slot 112. Conversely, FIG. 16 illustrates an upper power module 130 being inserted into or extracted from its respective mounting slot 110 and a lower power module 130 being fully inserted into its respective mounting slot 110.

Embodiments of the valve panel assemblies enable the valve panel bodies to move to a deployed or blocking position in which the panel body drops down by gravity or springs up by a spring force when the power module is removed from the mounting slot of the equipment rack. Each valve panel body includes a sheet metal panel that can rotate around a hinge or spindle, which is fixed to a shelf of the equipment rack. The power module includes a rounded corner or push pins at the back of the module that function to move the valve panel body to avoid damaging the valve panel body when installing the power module.

The valve panel assemblies 60, 70, 80 can be mounted within the mounting slot 110 in any desired orientation. For example, the panel assemblies 60, 70, 80 can be suitably mounted within a mounting slot 110 on sides of the mounting slot so that the valve panel bodies 62, 72, 82, respectively, extend in a horizontal direction within the mounting slot. To achieve this orientation, the valve panel assemblies 60, 70, 80 can be rotated 90 degrees.

One alternative to the bottom valve panel assembly and the combination valve panel assembly is to replace the spring with a magnet and/or provide a single spring instead of multiple springs. Another alternative to the top valve panel assembly and/or the combination valve panel assembly is to include a spring similar to the springs provided in the bottom valve panel assembly and the combination valve panel assemblies to spring load the top panel body. Another embodiment is to replace the hinge, e.g., the pin, with a standard hinge. Each valve panel body may include cutouts or openings to reduce its mass.

Although embodiments of the present disclosure illustrate power distribution modules being installed into and removed from the equipment rack, it should be understood that the assemblies of embodiments of the present disclosure can be employed within an equipment rack having any type of electronic module or device in a manner similar to the power distribution module.

Thus, it should be observed that embodiments of the present disclosure are directed to valve panel assembles function to reduce arc flash during removal of power modules and fan modules from the equipment rack. The valve panel assemblies block or otherwise reduce arc flash when removing such power modules and fan modules.

Redirection Plate

Figure 17:
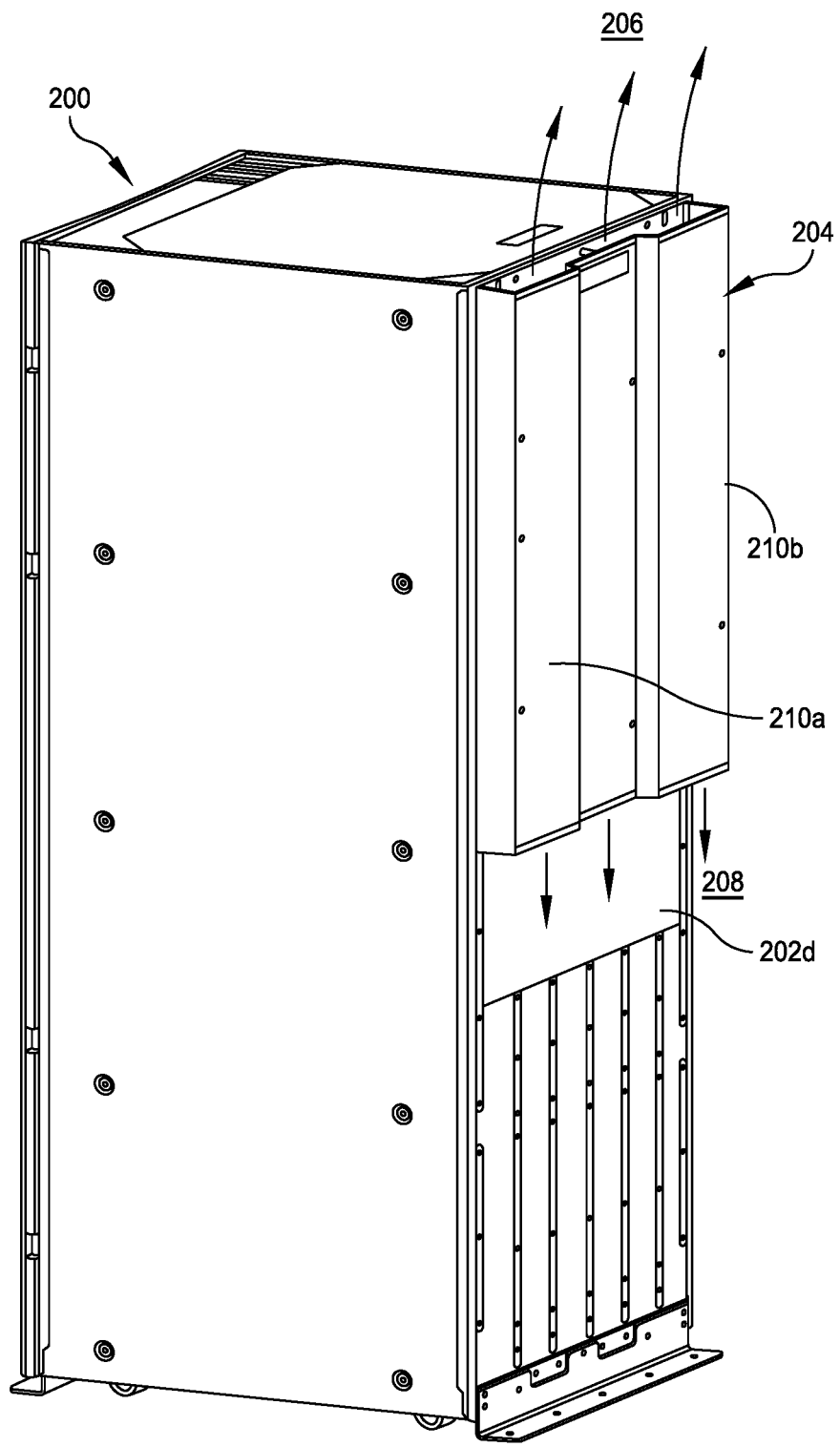
FIG. 17 is a perspective view of an equipment rack having a redirection plate of an embodiment of the present disclosure.
Figure 18:
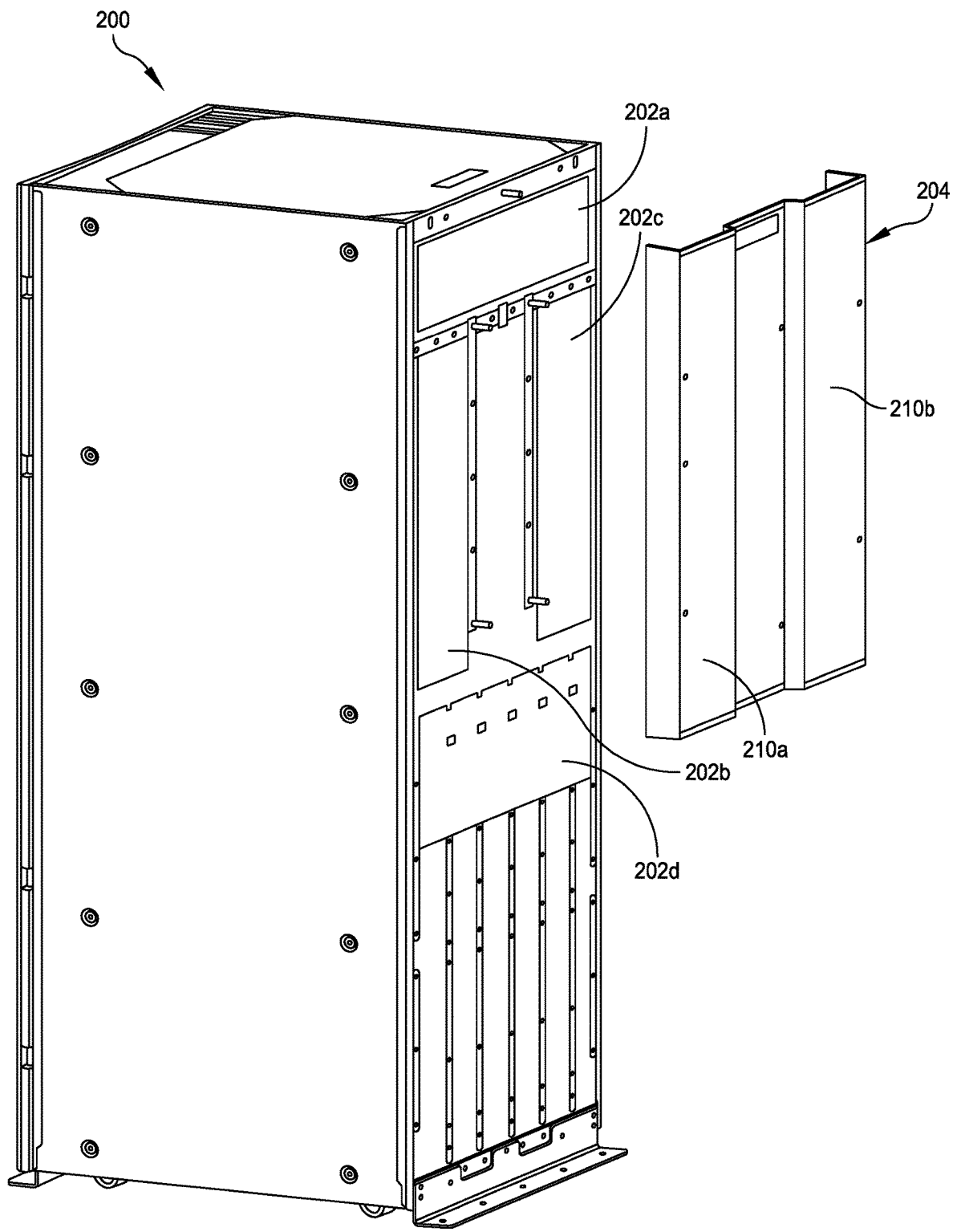
FIG. 18 is a perspective view of the equipment rack with the redirection plate spaced from the equipment rack.
Figure 19A:
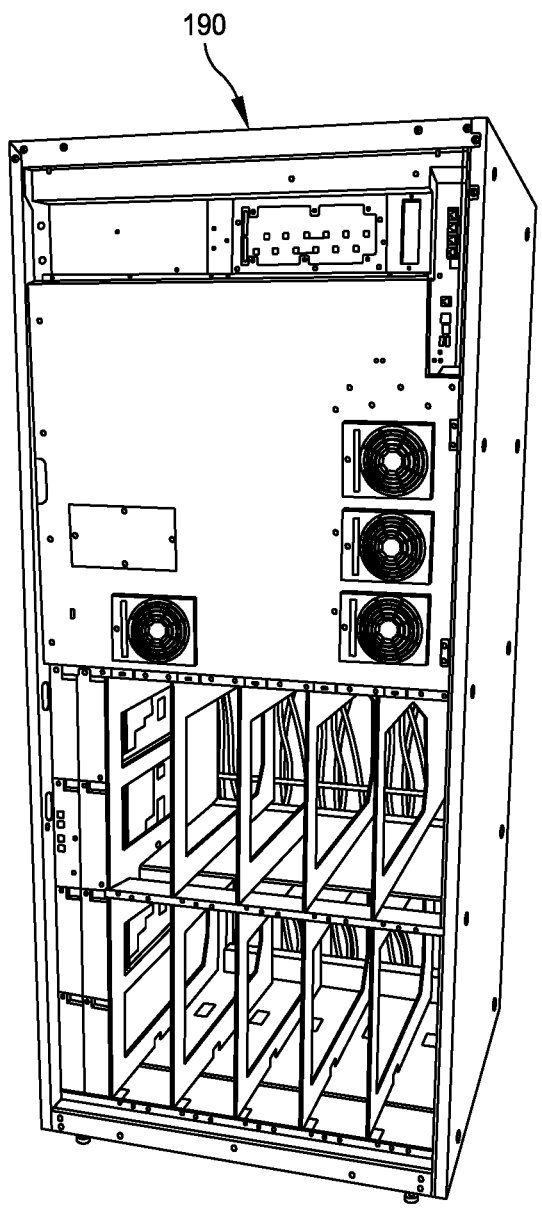
FIG. 19A is a front perspective view of an exemplary equipment rack.
Figure 19B:
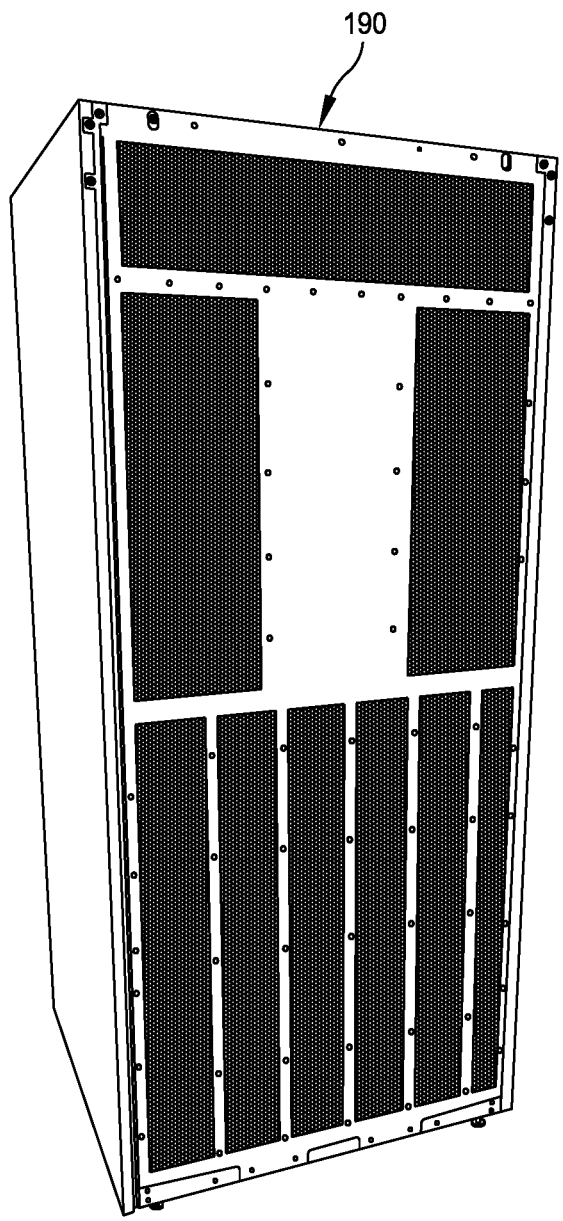
FIG. 19B is a back perspective view of the equipment rack shown in FIG. 19A.

Referring to FIGS. 17 and 18, an equipment rack is generally indicated at 200. A back of the equipment rack includes rear covers, each indicated at 202a, 202b, 202c, 202d, which can be touch compliant. The rear covers 202a-202d are provided to prevent access into the equipment rack 200. In one embodiment, the rear covers 202a-202d can be perforated or fabricated from mesh material to allow airflow through the equipment rack 200. As described, arc flash incidents can occur when removing power modules from the equipment rack. The flapper valves described herein are provided to assist in protecting operators located at the front of the equipment rack 200. To assist in protecting operators or personnel located at the back of the equipment rack 200, a redirection plate generally indicated at 204 is mounted on the back of the equipment rack. FIG. 17 illustrates the installed redirection plate 204 and FIG. 18 illustrates the redirection plate being presented to the equipment rack 200 prior to installation. The redirection plate 204 is configured to direct arc flash upwardly and downwardly, as indicated by arrows 206, 208. In some embodiments, the redirection plate 204 is configured to direct arc flash along a plane of the redirection plate. FIGS. 19A and 19B illustrate the front and back of an exemplary equipment rack, generally indicated at 190, respectively.

In one embodiment, the redirection plate 204 is rectangular in construction and configured to cover rear covers 202a, 202b, 202c, which for the equipment rack 200 shown is where arc flash incidents can occur. It should be understood that the rear covers can be configured to cover all or any part of the back of the equipment rack. As shown, the redirection plate 204 can be configured with raised portions 210a, 210b, which provide a gap or space between a portion of rear cover 202a and rear covers 202b, 202c when the redirection plate is secured to the equipment rack 200.

The rear covers 202a-202d and the redirection plate 204 enable touch and arc compliance from two separate structures. Thus, the provision of the rear covers 202a-202d and the redirection plate 204 enables enhanced air output through the perforated or meshed rear covers 202a-202b without excessive blocking of airflow from the redirection plate 204. The redirection plate 204 provides redirection of arc flash up/down (arrows 206, 208) to protect an operator from a direct blast that may arise in the event of an arc flash incident inside the upper half of the equipment rack 200. The provision of the redirection plate 204 further provides an additional covering behind the rear covers 202a-202d having the air exhaust openings. Further, the redirection plate 204 covers only a limited part of the total ventilation openings provided by the rear covers 202a-202d where incident energy is higher than a threshold limit. For example, the rear cover 202d is not covered by the redirection plate 204 because energies are lower in that location.

Figure 20:
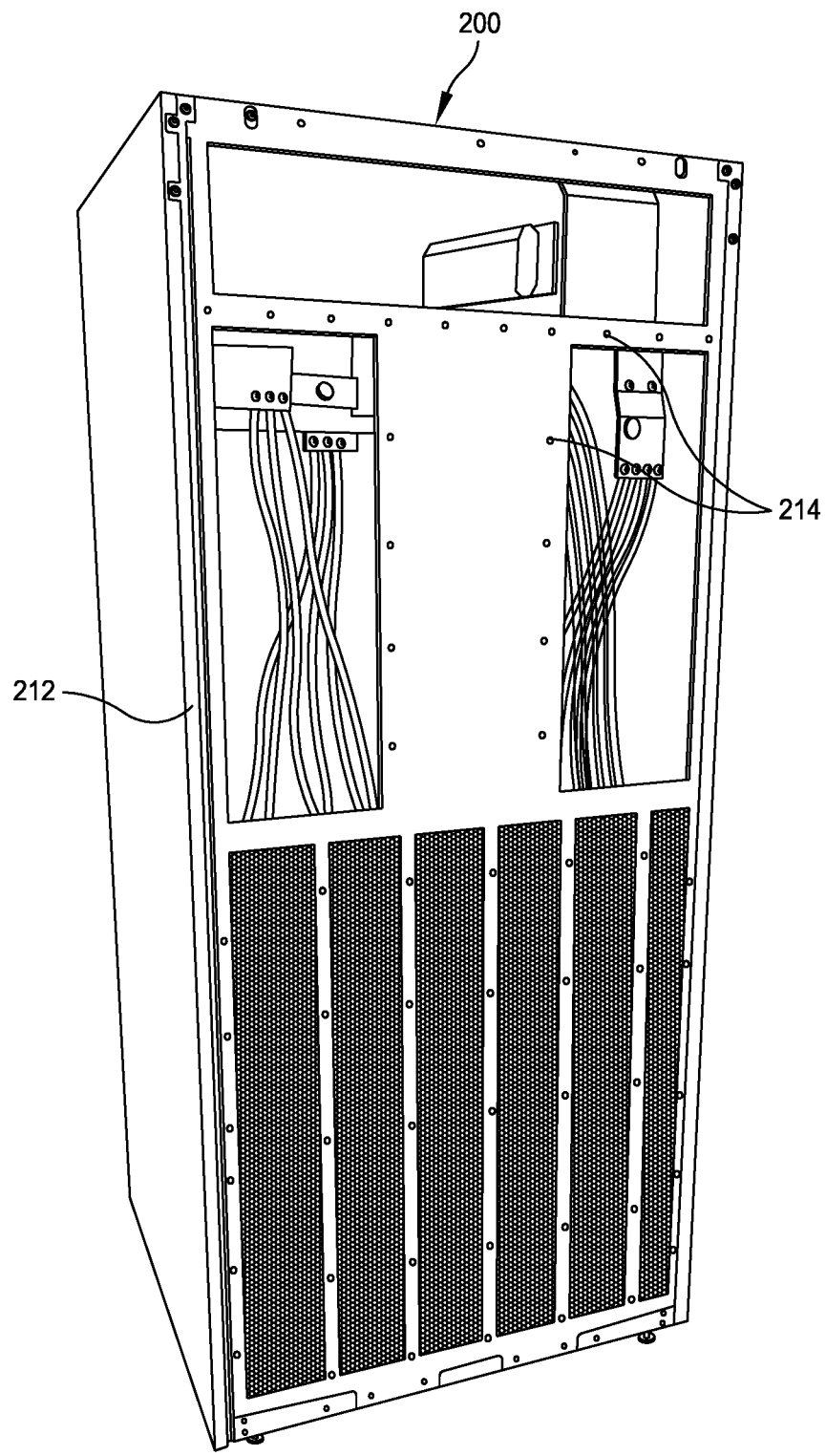
FIG. 20 is a back perspective view of another exemplary equipment rack showing openings for securing a redirection plate to the equipment rack.

Referring to FIG. 20, in one embodiment, the redirection plate 204 is mounted to a frame 212 of the equipment rack 200 by fasteners (not shown), which are secured to the frame by tapped openings, each indicated at 214, provided in the frame. In one embodiment, the redirection plate 204 is fabricated from galvanized plain carbon steel. The redirection plate 204 can be sized and shaped to a particular configuration based on where arc flash is to be reduced.

Fan Shroud

Figure 21:
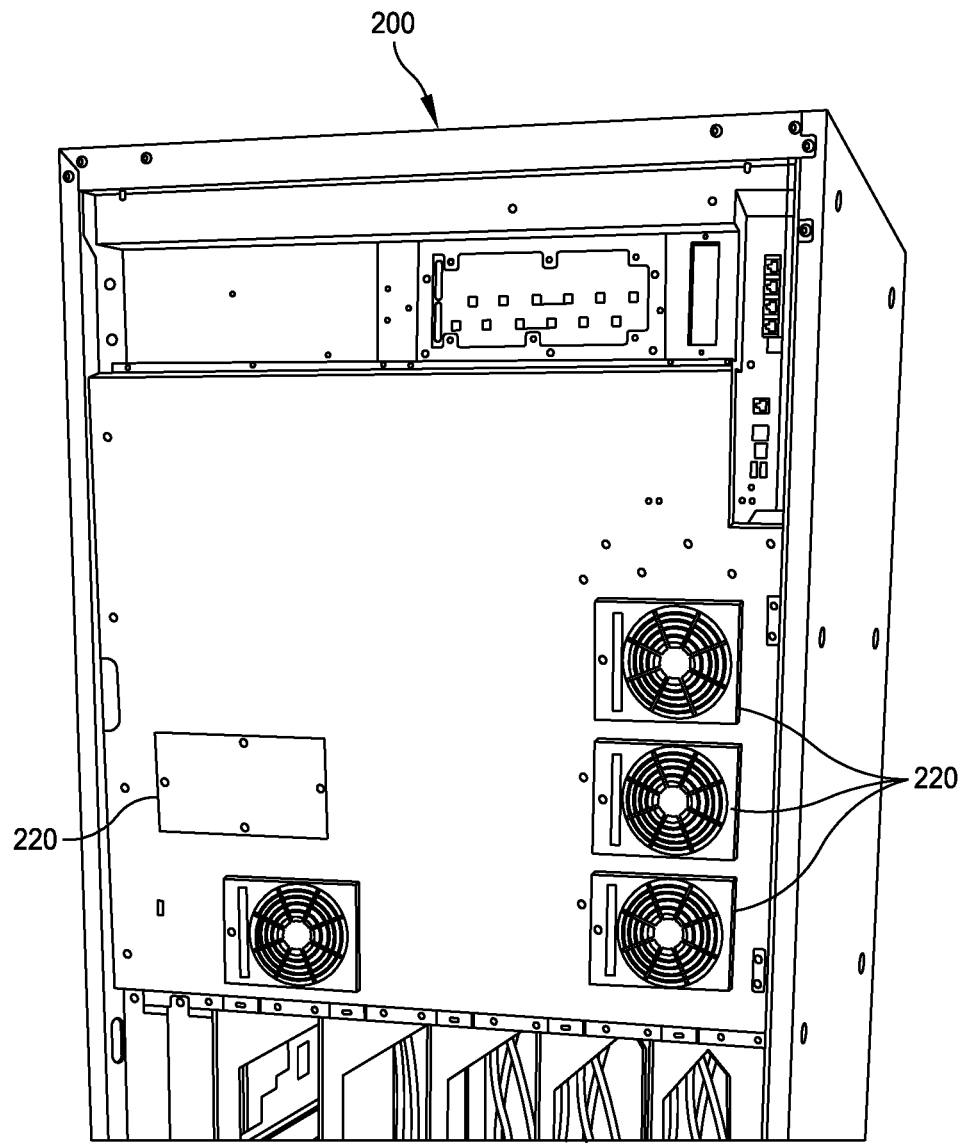
FIG. 21 is a front view of a portion of an equipment rack having several fan modules.

Referring to FIG. 21, a portion of the front of the equipment rack 200 is shown. As shown, the equipment rack 200 includes several fan modules, each indicated at 220. Although four fan modules 220 are shown, it should be understood that any number of fan modules can be provided at desired locations at the front of the equipment rack 200 to provide cooling inside the equipment rack.

Figure 22:
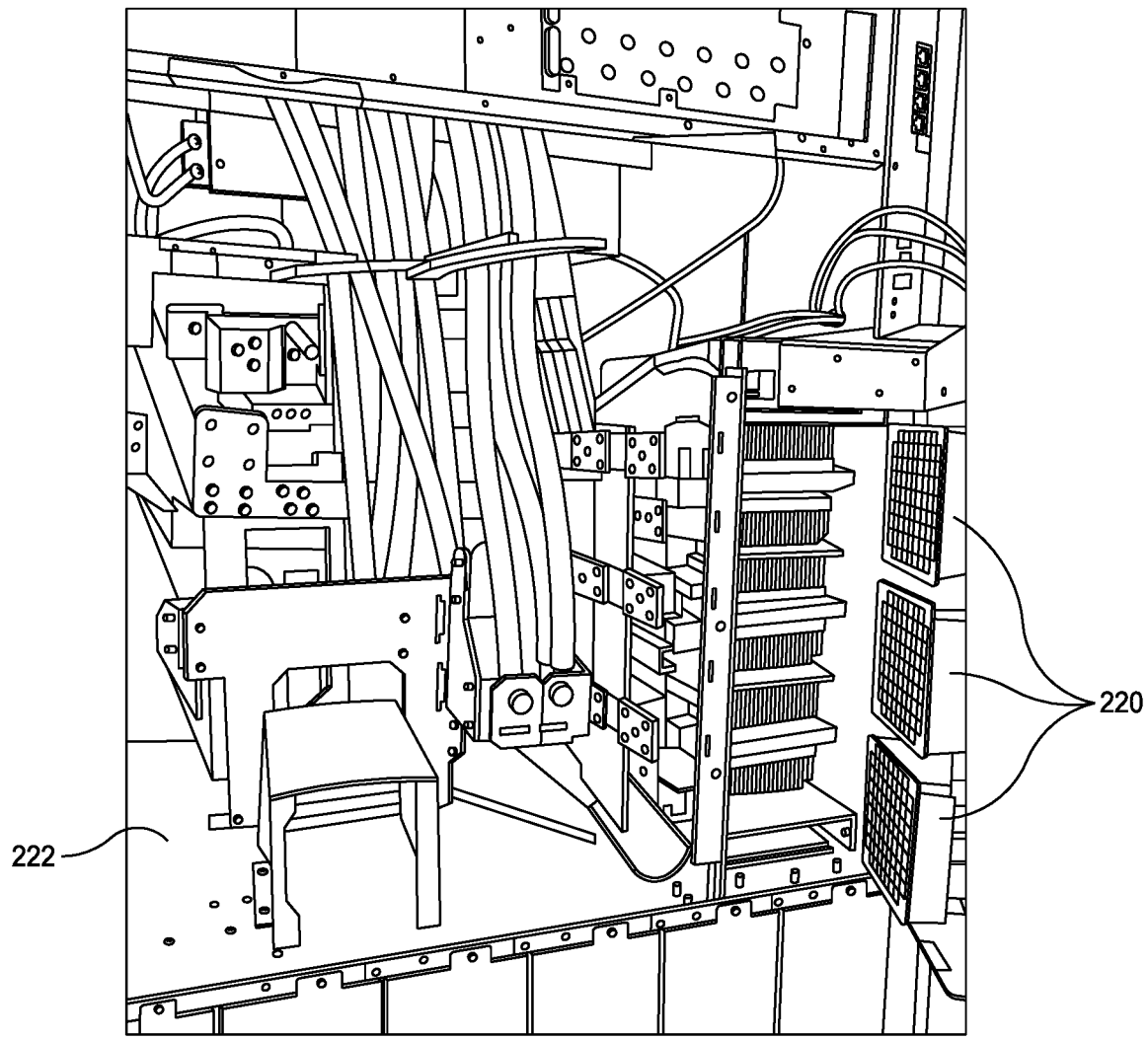
FIG. 22 is a front view of the equipment rack with equipment removed to show a power terminal area and backsides of the fan modules.

Referring to FIG. 22, the front of the equipment rack 200 is shown with equipment removed to show a power terminal area 222 and backsides of the fan modules.

Figure 23:
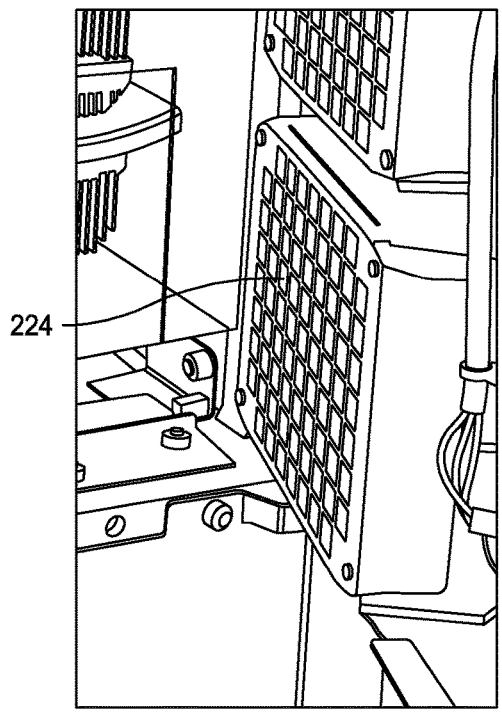
FIG. 23 is a perspective view of a grille of a fan module.

Referring to FIG. 23, an exemplary grille 224 of a fan module is shown. The fan shroud described herein is designed to replace the grille 224 shown in FIG. 23.

Figure 24:
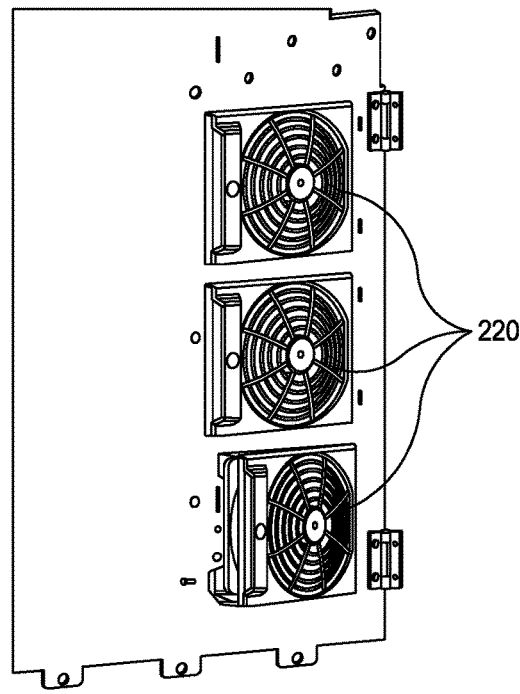
FIG. 24 is a perspective view of a portion of a front of an equipment rack showing three fan modules, with one fan module being removed from the equipment rack.

Referring to FIG. 24, a portion of the front of equipment rack 200 is shown. As shown, two fan modules 220 are mounted on the front of the equipment rack with the lowermost fan module being partially removed from the front of the equipment rack.

Figure 25:
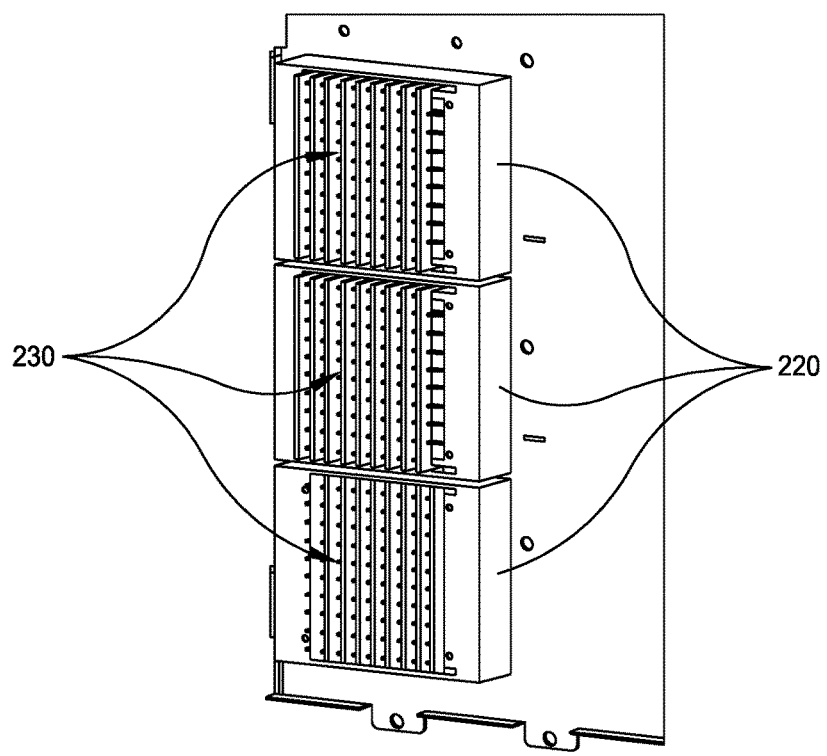
FIG. 25 is a perspective view taken from behind the front of the equipment rack shown in FIG. 24 showing fan shrouds of an embodiment of the present disclosure used to block access to the fan module.

Referring to FIG. 25, the backsides of the fan modules 220 of the equipment rack 200 are shown. As shown, fan shrouds, each generally indicated at 230, of an embodiment of the present disclosure are used to block access to the fan modules 220. In the shown embodiment, two fan shrouds 230 are illustrated in open positions to allow airflow from the fan modules 220 to the interior of the equipment rack 200. The lowermost fan shroud 230 is illustrated in a closed position to block airflow from the fan module 220 to the interior of the equipment rack 200 and to block arc flash for reaching the operator removing the fan module. When the fan module is removed, a spring-loaded shutting mechanism can be provided to block an arc flash incident.

Figure 26A:
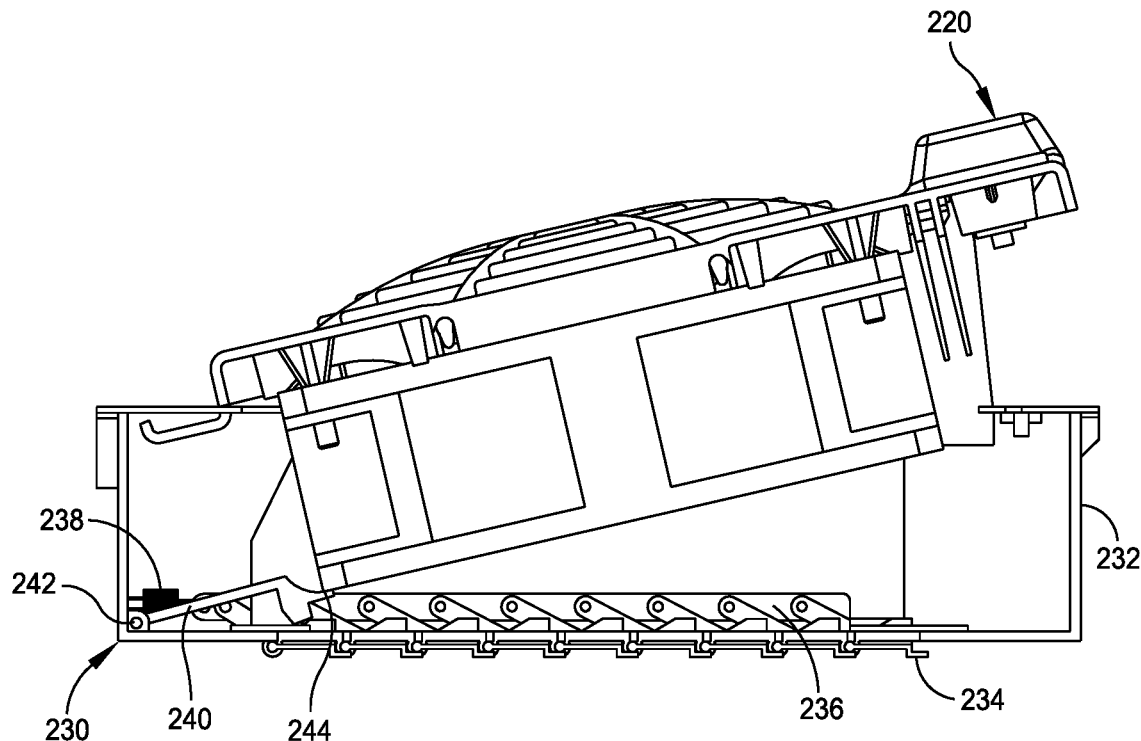
FIG. 26A is a cross-sectional view showing the fan module being removed from the equipment rack with the fan shroud shown in the closed position.
Figure 26B:
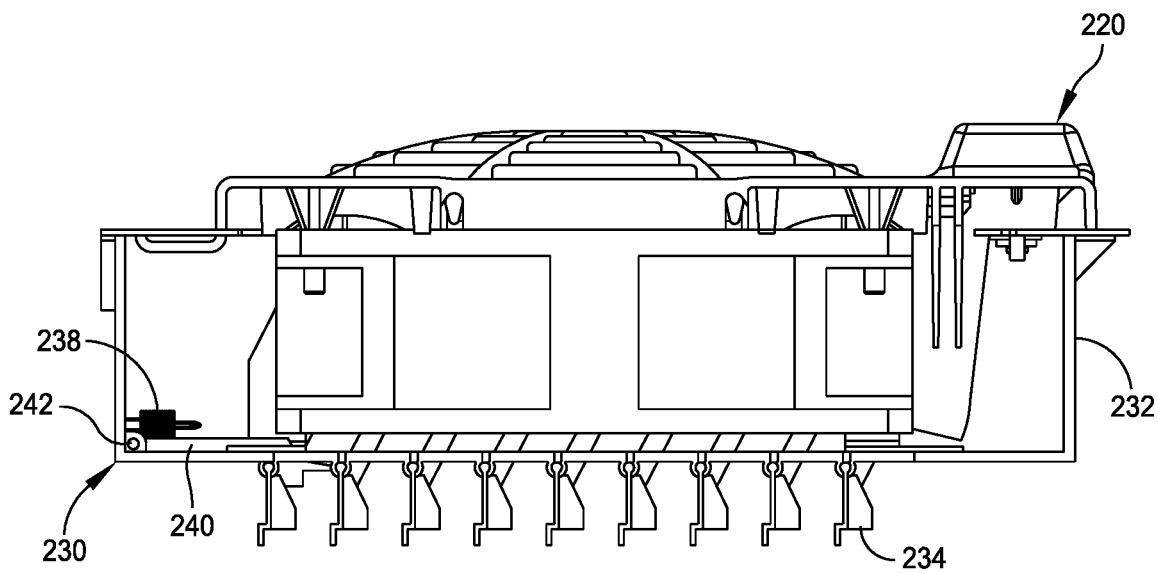
FIG. 26B is a cross-sectional view showing the fan module secured to the equipment rack with the fan shroud in the open position.

FIG. 26A illustrates the fan module 220 being removed from the equipment rack with the fan shroud 230 shown in the closed position to block airflow and to block arc flash. FIG. 26B illustrates the fan module 220 fully secured to the equipment rack with the fan shroud 230 in the open position to allow airflow from the fan module to the interior of the equipment rack. In one embodiment, the fan shroud 230 includes a base 232 having a shutter assembly including a shutter 234 and a linkage arm 236 connected to the shutter to move the shutter between a closed position (FIG. 26A) and an open position (26B). The fan shroud 230 further includes a spring 236 to bias the linkage arm 236 and the shutter 234 to the closed position.

The fan shroud 230 further includes a sliding mechanism 240 hingedly coupled to the base by a pin 242 and coupled to the linkage arm 236. The sliding mechanism 240 is operated mechanically when receiving the fan module 220, with a portion of the fan module engaging a portion of the sliding mechanism at 244. When the fan module 220 is removed or inserted into the fan shroud 230 (FIG. 26A), the portion of the fan module engages the portion of the sliding mechanism 240 at 244 to move the linkage arm 236 against the bias of the spring 238. Once seated, the linkage mechanism 236 and the shutter 234 are moved to the open position. The fan module 220 can include a seating pin 246 that is received within a pin positioner 248 provided on the base 232 of the fan shroud 230. The fan module 220 is inserted into the fan shroud 230 about a hinge point provided at 250.

Figure 27A:
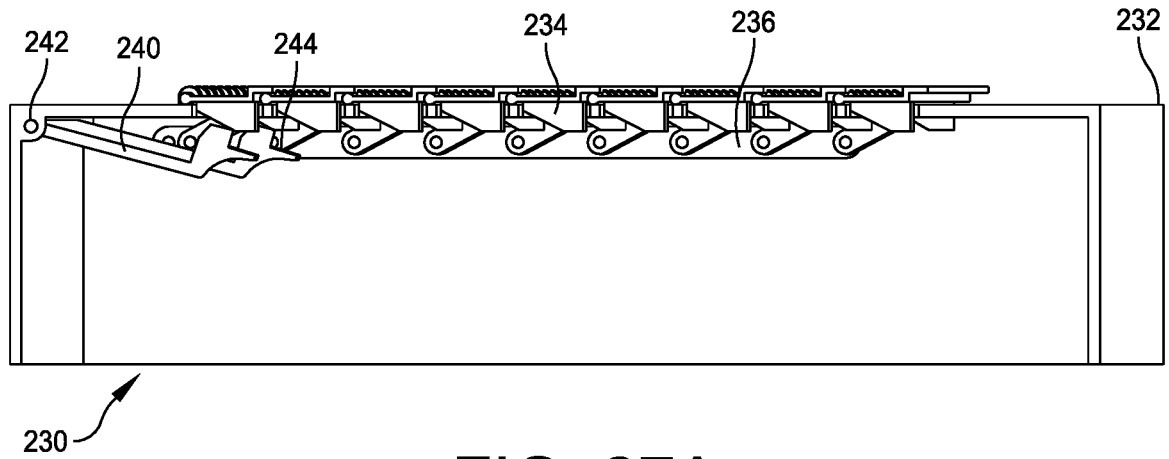
FIGS. 27A and 27B are cross sectional views of the fan shroud with the fan shroud in the closed position.
Figure 27B:
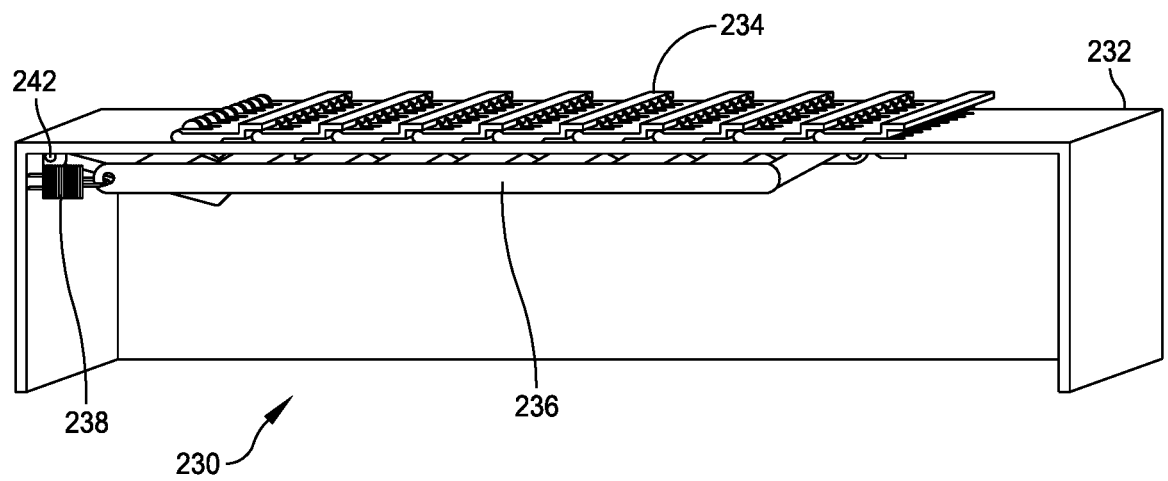

FIGS. 27A and 27B illustrate aspects of the construction of the fan shroud, including the base, the shutter, the linkage arm, spring, and the sliding mechanism.

Figure 28A:
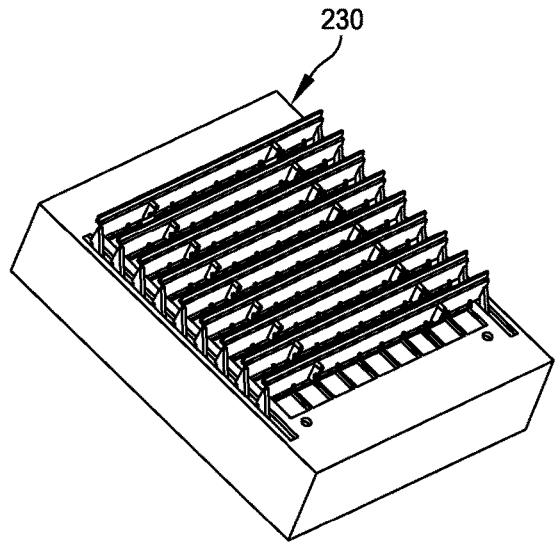
FIGS. 28A, 28B and 28C are perspective views of the fan shroud with the fan shroud in the open position.
Figure 28B:
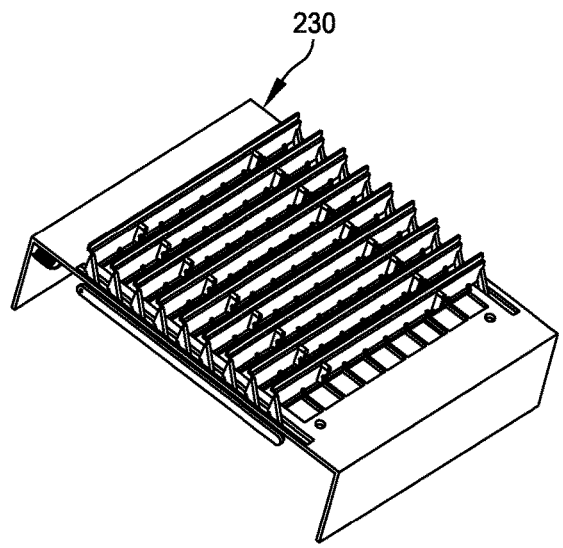
Figure 28C:
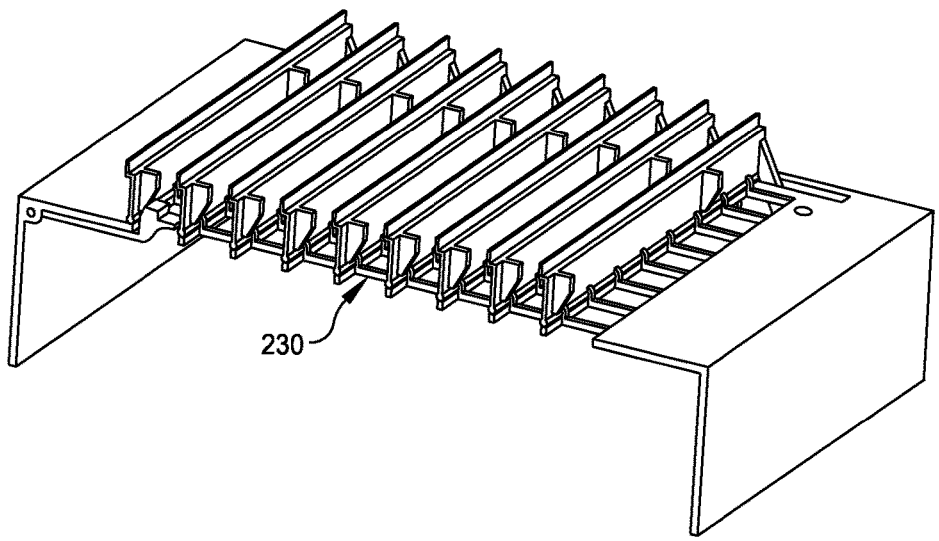

FIGS. 28A, 28B and 28C illustrate the fan shroud in the open position.

Figure 29:
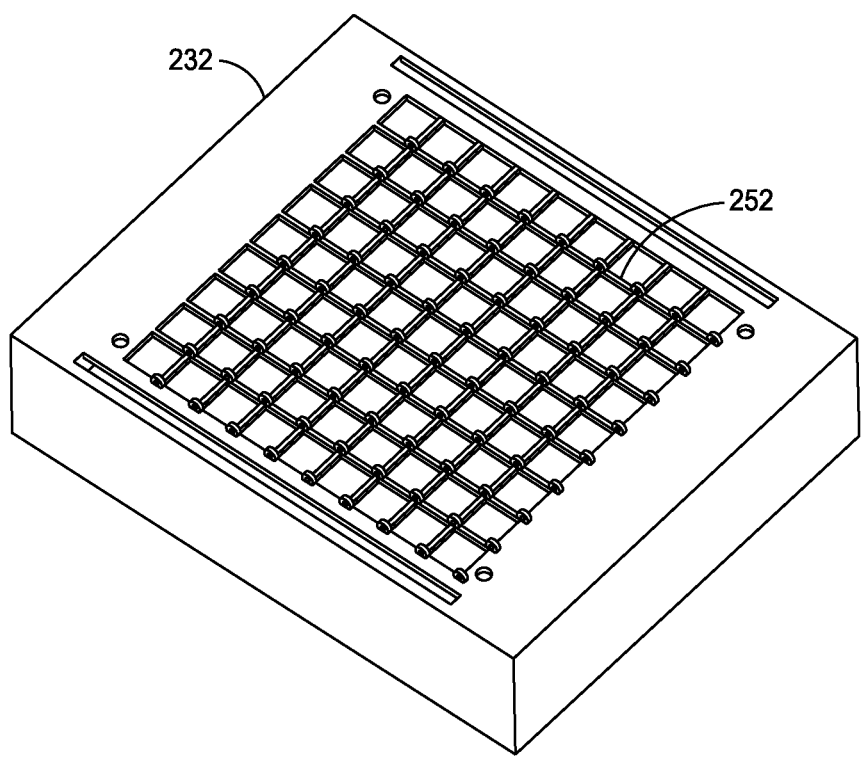
FIG. 29 is a perspective view of a base of the fan shroud.

FIG. 29 illustrates the base 232 of the fan shroud. As shown, in one embodiment, the base 232 includes a grille portion 252 that enables airflow through the base.

Figure 30:
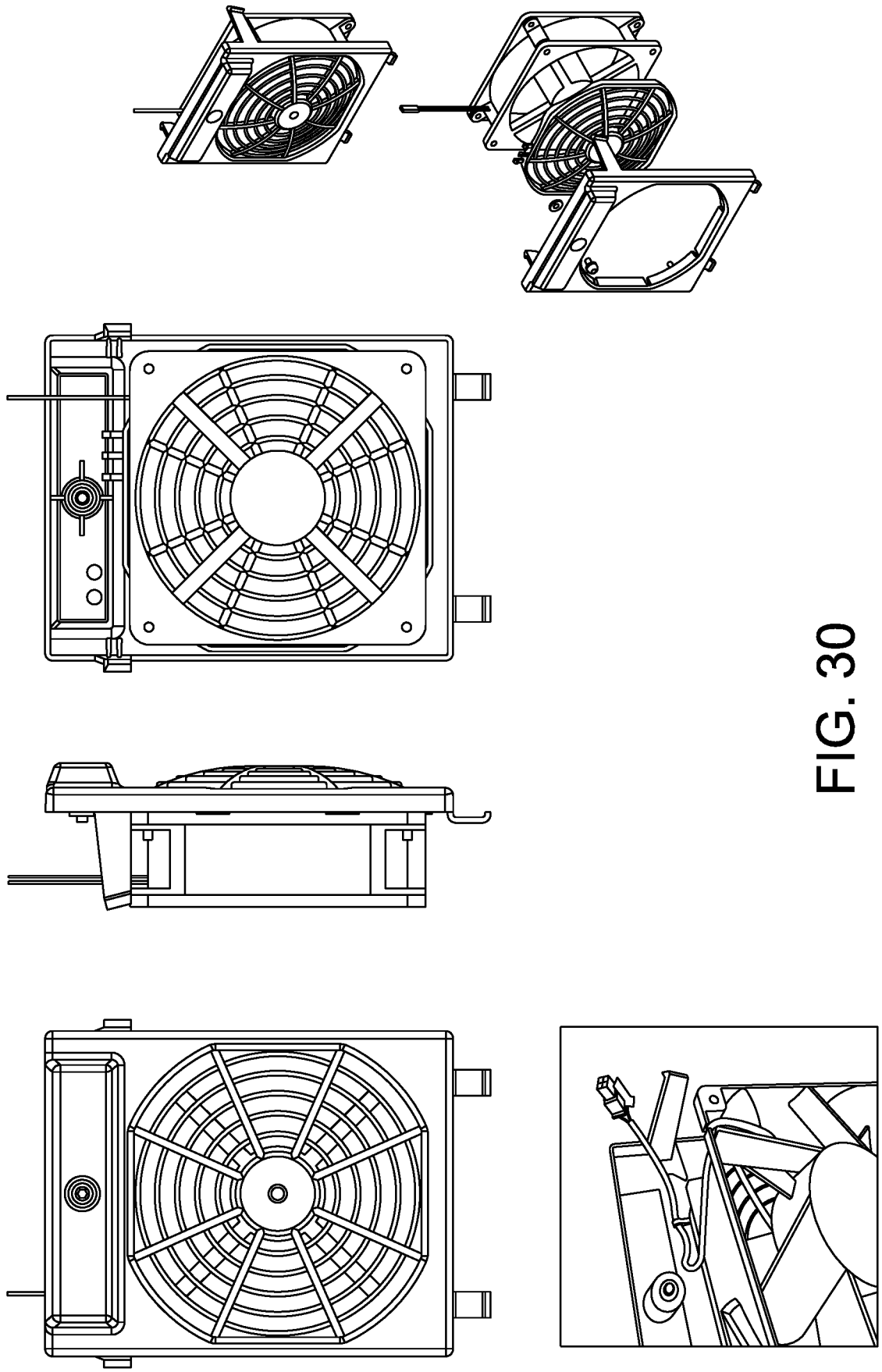
FIG. 30 are views of an exemplary fan module.

FIG. 30 are views of an exemplary fan module.

Flap Valve with Torsion Bar

With arc flash assemblies, as described above, flap valves can be employed to contain energy from arc flash incidences. The arc flash assembly can include several parts to bias the flap (or flaps) in an operable position, which potentially can add to the cost of the arc flash flap assembly. As described above, the flaps can employ coil springs, which can be difficult to install and requires an appreciable amount of space to operate.

Referring to FIGS. 31-38, a flap valve assembly of another embodiment of the present disclosure is generally indicated at 310. As shown, the flap valve assembly includes a valve panel body 312 that is secured to frame members 314, 316 by a torsion bar, which is generally indicated at 320. It should be observed that embodiments of the present disclosure are directed to the provision of the torsion bar 320 that is configured to bias the valve panel body 312 and uses fewer, less expensive parts, is easier to install, and requires less room than coil spring assemblies.

Figure 31:
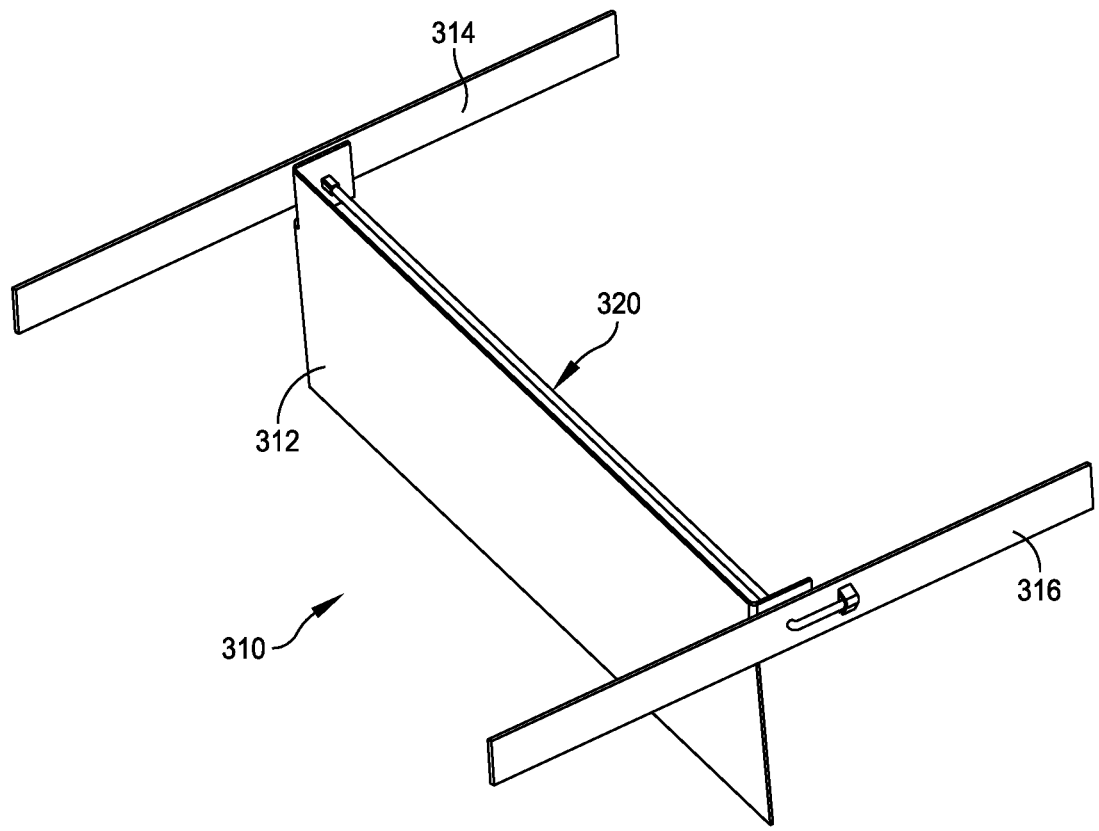
FIG. 31 is a perspective view of a flap valve assembly of an embodiment of the present disclosure including a torsion bar to bias a flap valve panel.
Figure 32:
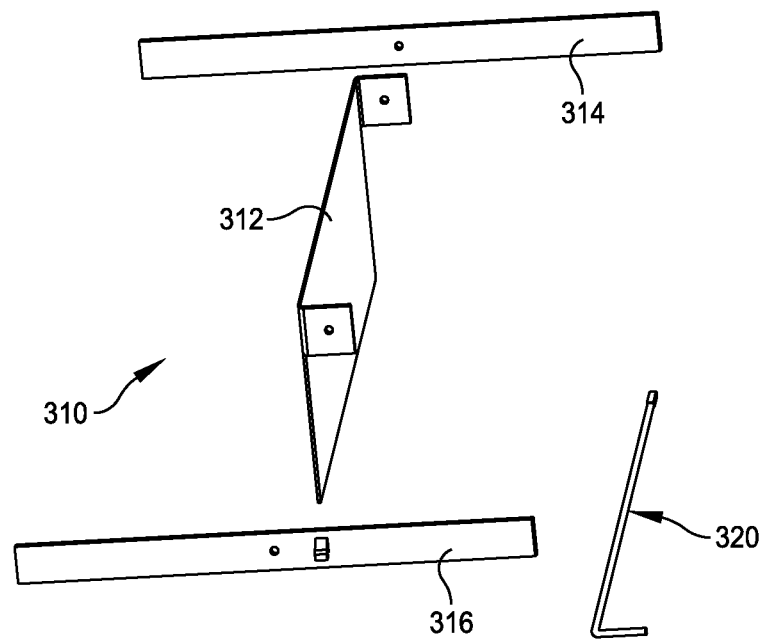
FIG. 32 is a side view of a flap valve assembly of an embodiment of the present disclosure showing a torsion bar removed from a flap valve panel.

As shown in FIGS. 31 and 32, the valve panel body 312 is hingedly secured to the frame members 314, 316 of a rack enclosure by the torsion bar 320, which is provided to bias the valve panel body in an operable (vertical) position. In some embodiments, the torsion bar 320 can be fabricated from raw material that can be 3-10 millimeters (mm) diameter straight spring steel, which is cut to a required length and manipulated (tooling/compression/frustrating) to form a square section at one end and bent section at another end.

Referring to FIGS. 33A-33C, the torsion bar 320 includes an elongate rod 322 having a square end section 324 at one end of the torsion bar (FIG. 33B) and a bent section 326 for clamping the torsion bar at the other end of the torsion bar in a fixed or secured condition with respect to the frame member, e.g., frame member 316.

Referring to FIGS. 34A-34C, the square end section 324 of the torsion bar 320 is sized to enter a square-shaped opening 328 formed in a portion 330 of the valve panel body 312 to ensure that the valve panel body rotates when the torsion rod is rotated. As shown in FIG. 34B, the portion 330 extends perpendicularly from the valve panel body 312 and can be formed by bending the valve panel body. The free end of the square end section 324 extends through a circular opening 332 provided in the frame member 314, with the circular opening being aligned with the square-shaped opening 328. Accordingly, the square end section 324 is provided to drive the movement or rotation of the valve panel body 312. The torque or drive force can be calculated by the torsion length of the rod 322 of the torsion bar 320 with a spring specification. As shown in FIG. 34C, the bent section 326 is sized to enter a circular opening 334 formed in a portion 336 of the valve panel body 312 that is opposite to portion 330, with the portions generally mirroring one another. The free end of the bent section 326 of the torsion bar 320 extends through a circular opening 338 provided in frame member 316, with the circular openings being aligned with one another. The torsion bar 320 can rotate freely among the openings 332, 338 provided on the frame members 314, 316, respectively, of the rack frame.

Figures 35A, 35B:
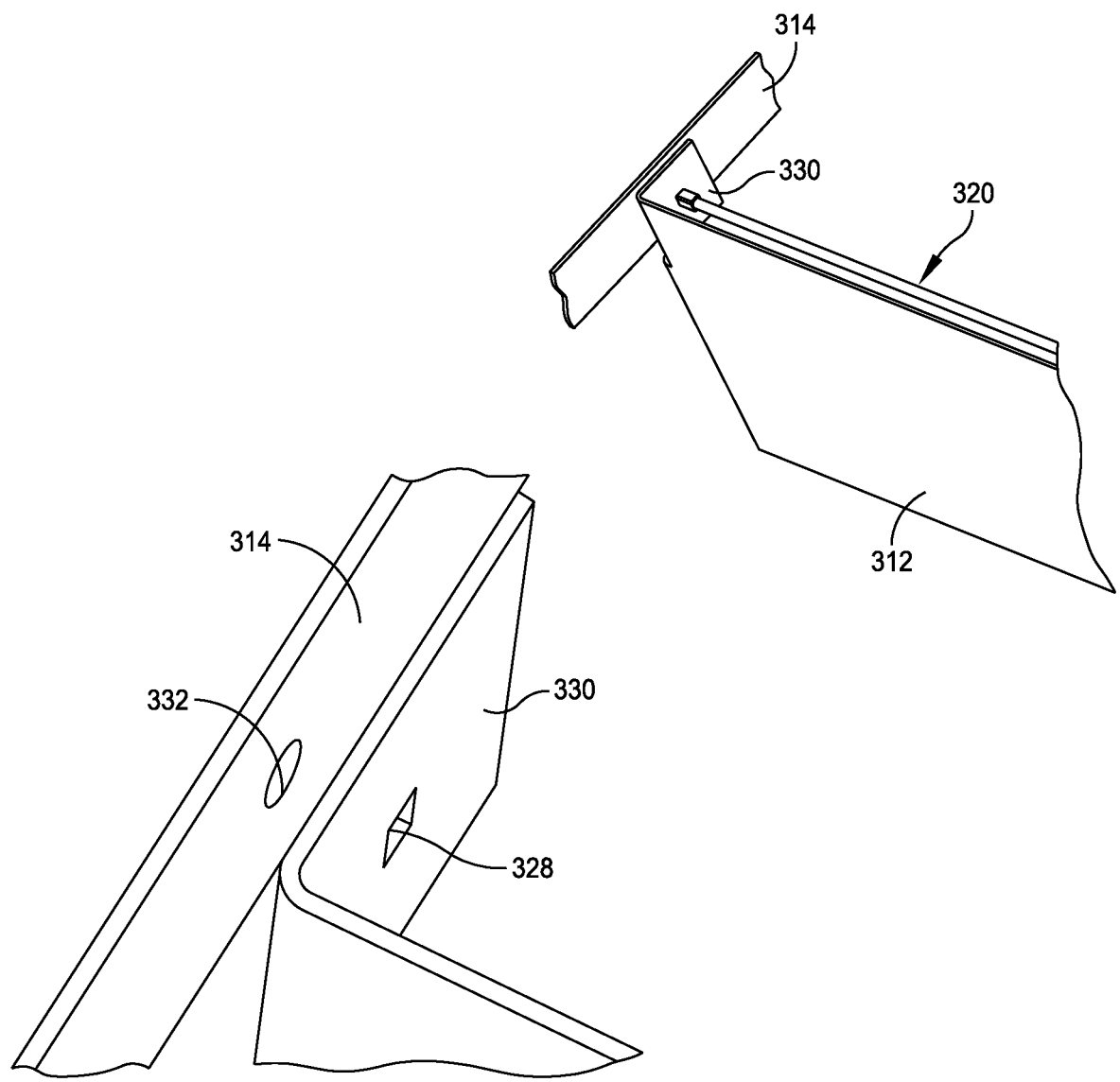
FIGS. 35A and 35B are perspective views of a portion of the flap valve assembly shown in FIGS. 34A-34C.

FIGS. 35A and 35B illustrate the square-shaped opening 328 for tight tolerance with the square end section 324 of the torsion bar 320 to enable the torsion bar to drive the rotation of the valve panel body 312. The square-shaped opening 328 is aligned with the circular opening 332 of the frame member 314 for free rotation of the torsion bar 320 and the valve panel body 312 with respect to the frame member.

Figure 36A:
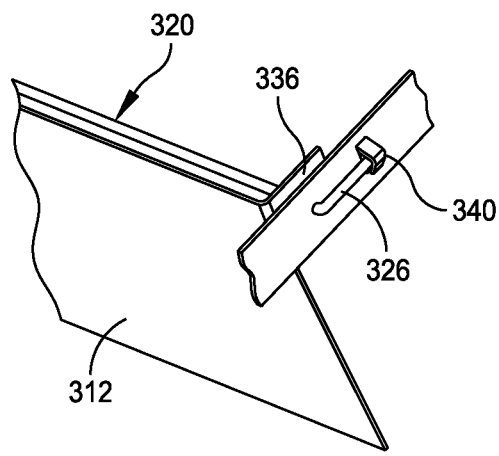
FIGS. 36A and 36B are perspective views of another portion of the flap valve assembly shown in FIGS. 34A-34C.
Figure 36B:
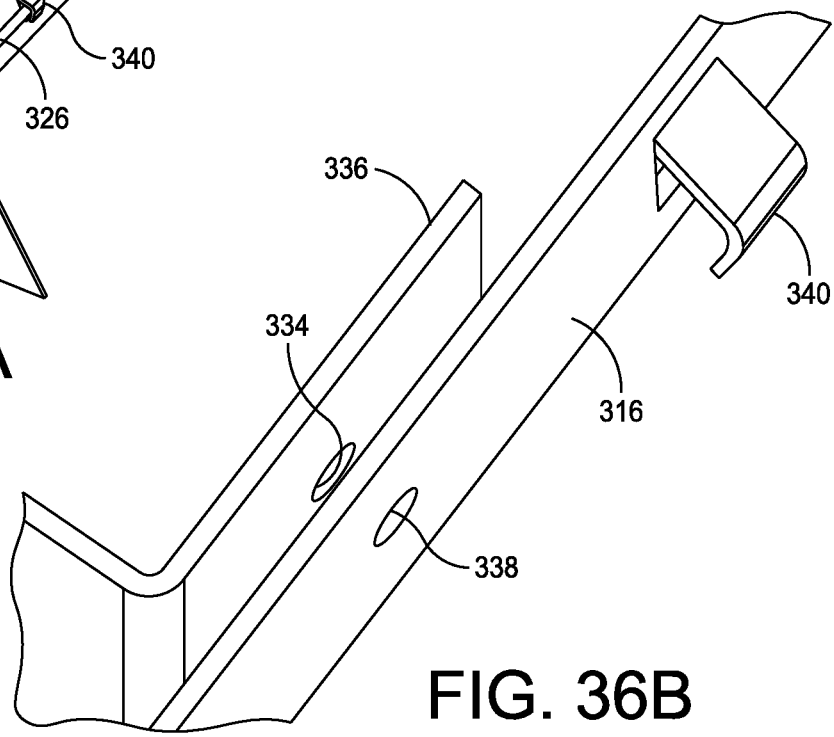
Figure 37:
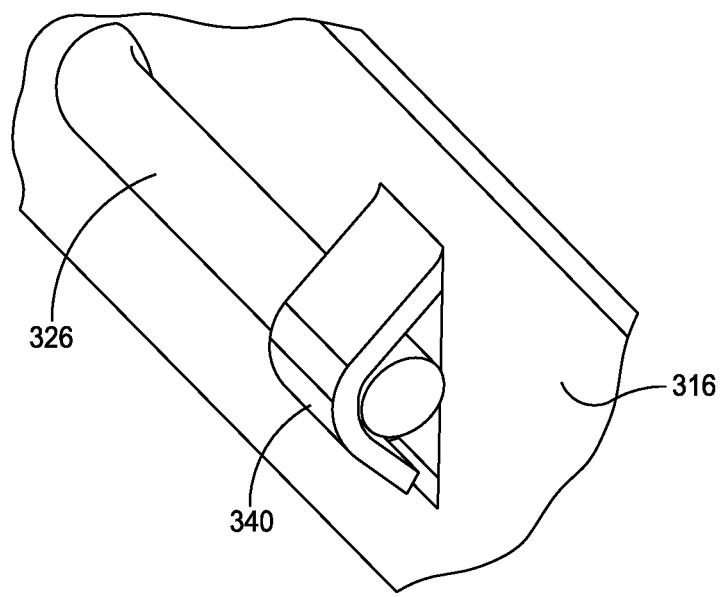
FIG. 37 is an enlarged perspective view of a feature used to clamp or secure an end of the torsion bar.

FIGS. 36A and 36B illustrate the circular opening 334 of the portion 336 of the valve panel body 312 positioned proximate to the circular opening of the frame member 316, with the openings aligned with one another. This structure facilitates the rotation of the torsion bar 320 and the valve panel body 312. Referring additional to FIG. 37, the frame member 316 includes a feature 340 that is provided to clamp or secure the free end of the bent section 326 of the torsion bar 320. As shown, the free end of the bent section 326 of the torsion bar 320 is covered by the feature 340 and prevents the upward movement of the free end of the bent section of the torsion bar.

Figure 38:
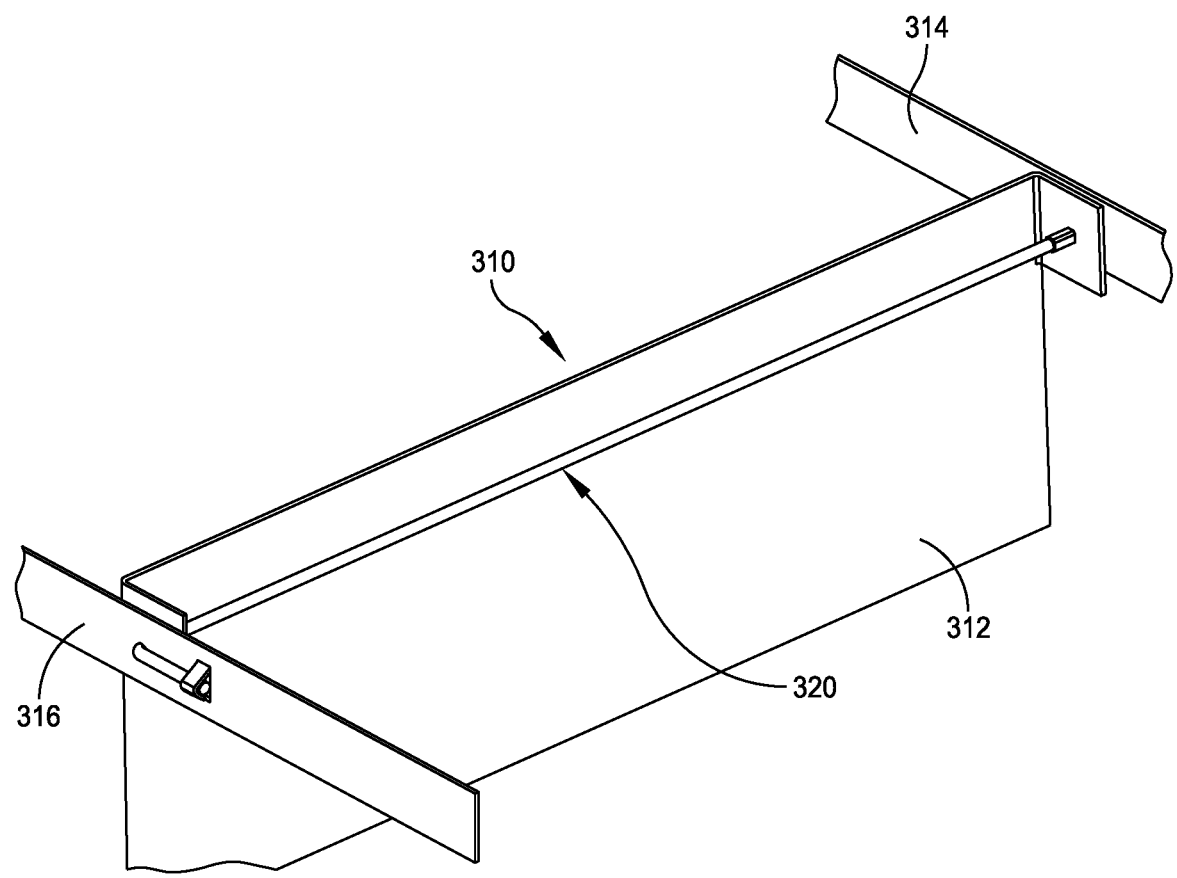
FIG. 38 is a perspective view of a flap valve assembly of an embodiment of the present disclosure.

FIG. 38 illustrates the flap valve assembly in a fully assembled condition. During assembly, the bent section 326 of the torsion bar 320 is inserted into the opening 334 of the portion 336 of the valve panel body 312 and the opening 338 of the frame member 316. The other end of the torsion bar 320 having the square end section 324 is inserted into the square-shaped opening 328 of the portion 330 of the valve panel body 312 and the opening 332 of the frame member 314. The bent section 326 of the torsion bar 320 can be rotated with respect to the frame member 316 so that the free end of the bent section is captured by the feature 340.

Thus, it is observed that the L-shaped torsion bar 320 is configured to maintain the valve panel body 312 in a closed position when no force is applied to the valve panel body. The valve panel body 312, when closed, prevents or limits energy from arc flash in a UPS power module housing to protect an operator installing a power module or device. As the valve panel body 312 rotates (to an open position), the torsion bar 320 exerts a force on the valve panel body to return the valve panel body to a normal (closed) position.

Thus, it should be observed that the systems and methods disclosed herein, including the flapper valves, the redirection plate, and the fan shroud are designed to operate and reduce arc flash incident energy without human interaction.

In some embodiments, a mechanism that separates touch and arc compliance is provided.

In some embodiments, airflow throughput through the meshed hole pattern is achieved without undue restriction.

In some embodiments, touch compliance is provided by means of non-moving elements (no failing elements).

In some embodiments, arc compliance is provided by means of a shutter mechanism of the fan shroud that is controlled by a spring element to rest in or move to normal closed position when a fan module is being moved, inserted or is absent.

In some embodiments, the same shutter mechanism of the same shroud is pushed open by a driver part that translates the position of the fan module into a movement of the shutter mechanism so that when the fan module is fully inserted, the shutter mechanism is forced open to promote airflow. At this point arc compliance is ensured by the fan module.

In some embodiments, the linkage arm and the spring of the fan shroud may be replaced by an electrically operated motor so that the shutter mechanism can be closed remotely from a controller, so that the shutter mechanism is closed before the fan module replacement and/or repair begins.

In some embodiments, the linkage arm and the spring of the fan shroud may be replaced by a turning knob, so that the mechanism can be closed before replacement of the fan module.

In some embodiments, a fan/shutter mechanism may be configured so that in the event of a blast (pressure surge), a structural weak point will allow the fan module to fly out of its hinge. When the fan module is out of its hinge, the lever can move so the sliding element is opened, so that the spring can pull the shutter mechanism to closed state and stop the accident.

In some embodiments, the shutter mechanism is designed so that the pressure surge will force the shutter mechanism to return to closed position without the fan flying out of its hinge. The structural weak point would then be built into the shutter mechanism or the piston element.

In some embodiments, the fan shroud can be designed to function by gravity to block airflow and using the fan module airflow and pressure to open it.

In some embodiments, the fan shroud can be designed so that instead a piece of material yielding in on the event of an arc, a spring would yield in a non-destructive mode.

As used herein, an open power source may be a power source that is touch compliant and/or touch safe, or the like.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. An assembly to contain energy from arc flash within a mounting slot of an equipment rack, the assembly comprising:
   a valve panel assembly including
      a first valve panel body secured to a chassis of the equipment by at least one hinge,
      a second valve panel body secured to the chassis of the equipment rack by the at least one hinge, each of the first valve panel body and the second valve panel body being configured to rotate between an open position configured to allow a module to be inserted into the mounting slot and a closed position blocking the energy from the arc flash when the module is removed from the mounting slot, and
      a spring configured to bias the first valve panel body to the closed position,
      wherein the second valve panel body is biased to the closed position by gravity.

2. The assembly of claim 1, wherein the at least one hinge includes a first hinge and a second hinge, the first hinge extending along an edge of the first valve panel body and the second hinge extending along an edge of the second valve panel body.

3. The assembly of claim 2, wherein the first hinge extends along a bottom edge of the first valve panel body and the second hinge extends along a top edge of the second valve panel body.

4. The assembly of claim 2, wherein the first hinge is secured to the chassis of the equipment rack by a first bracket and the second hinge is secured to the chassis of the equipment rack by a second bracket.

5. The assembly of claim 1, wherein the spring is a coil spring that is mounted on one end of the at least one hinge, the coil spring having one end configured to engage the first valve panel body and another end that engages a portion of the chassis.

6. The assembly of claim 1, further comprising a redirection plate secured to the chassis of the equipment rack, the redirection plate being configured to direct the arc flash along a plane of the redirection plate.

7. The assembly of claim 1, further comprising a fan shroud coupled to the chassis of the equipment rack, the fan shroud being configured to receive a fan module to provide airflow to electronic equipment, the fan shroud further being configured to operate in a first position in which the fan module is received by the fan shroud and a second position in which the fan shroud blocks the arc flash when the fan module is installed or removed from the fan shroud.

8. A method of selectively blocking access to a portion of the equipment rack within the mounting slot of the chassis of the equipment rack with the assembly of claim 1.

9. An equipment rack comprising:
   a chassis having a mounting slot;
   an open power source located at a back of the chassis; and
   a valve panel assembly including
      a first valve panel body secured to the chassis by at least one hinge,
      a second valve panel body secured to the chassis by the at least one hinge, each of the first valve panel body and the second valve panel body being configured to rotate between an open position configured to allow a module to be inserted into the mounting slot and a closed position blocking the energy from arc flash when the module is removed from the mounting slot, and
      a spring configured to bias the first valve panel body to the closed position,
      wherein the second valve panel body is biased to the closed position by gravity.

10. The equipment rack of claim 9, wherein the at least one hinge includes a first hinge and a second hinge, the first hinge extending along an edge of the first valve panel body and a second hinge extending along an edge of the second valve panel body.

11. The equipment rack of claim 10, wherein the first hinge extends along a bottom edge of the first valve panel body and the second hinge extends along a top edge of the second valve panel body.

12. The equipment rack of claim 10, wherein the first hinge is secured to the chassis by a first bracket and the second hinge is secured to the chassis by a second bracket.

13. The equipment rack of claim 12, wherein the spring is a coil spring that is mounted on one end of the at least one hinge, the coil spring having one end configured to engage the first valve panel body and another end that engages a portion of the chassis.

14. The equipment rack of claim 9, further comprising a redirection plate secured to the chassis, the redirection plate being configured to direct the arc flash along a plane of the redirection plate.

15. The equipment rack of claim 9, further comprising a fan shroud coupled to the chassis, the fan shroud being configured to receive a fan module and to provide airflow from the fan module to the electronic equipment, the fan shroud further being configured to operate in a first position in which the fan module is received by the fan shroud and capable of providing the airflow to the electronic equipment and a second position in which the fan shroud blocks the arc flash when the fan module is installed or removed from the fan shroud.

16. A method of selectively blocking access to a portion of the equipment rack within the mounting slot of the chassis of the equipment rack of claim 9.

17. A method of assembling a system to contain energy from arc flash within a mounting slot of an equipment rack, the method comprising:
   hingedly mounting a first valve panel body to a frame of the equipment rack by a first hinge; and
   hingedly mounting a second valve panel body to the frame of the equipment rack by a second hinge,
   wherein each of the first valve panel body and the second valve panel body being configured to rotate between an open position configured to allow a module to be inserted into the mounting slot and a closed position blocking the energy from the arc flash when the module is removed from the mounting slot, wherein a spring configured to bias the first valve panel body to the closed position, and wherein the second valve panel body is biased to the closed position by gravity.

18. The method of claim 17, wherein the first hinge extends along an edge of the first valve panel body and the second hinge extends along an edge of the second valve panel body.

19. The method of claim 17, wherein the first hinge extends along a top bottom edge of the first valve panel body and the second hinge extends along a top edge of the second valve panel body.

20. The method of claim 17, wherein hingedly mounting the first valve panel body to the frame of the equipment rack includes securing the first hinge to the frame by a first bracket and hingedly mounting the second valve panel body to the frame of the equipment rack includes securing the second hinge to the frame by a second bracket.

21. The method of claim 17, wherein the spring is a coil spring that is mounted on one end of the first hinge, the coil spring having one end configured to engage the first valve panel body and another end that engages a portion of the frame of the equipment rack.

22. The method of claim 17, further comprising securing a redirection plate to the frame of the equipment rack, the redirection plate being configured to direct the arc flash along a plane of the redirection plate.

23. The method of claim 17, further comprising a fan shroud coupled to the equipment rack, the fan shroud being configured to receive a fan module to provide airflow to electronic equipment, the fan shroud further being configured to operate in a first position in which the fan module is received by the fan shroud and a second position in which the fan shroud blocks the arc flash when the fan module is installed or removed from the fan shroud.

* * * * *